United States Patent
Miyagi et al.

(10) Patent No.: US 9,028,621 B2
(45) Date of Patent: May 12, 2015

(54) SUBSTRATE CLEANING METHOD AND SUBSTRATE CLEANING DEVICE

(75) Inventors: Tadashi Miyagi, Kyoto (JP); Masahiko Harumoto, Kyoto (JP); Sadayasu Suyama, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 0 days.

(21) Appl. No.: 13/116,793

(22) Filed: May 26, 2011

(65) Prior Publication Data

US 2012/0006361 A1 Jan. 12, 2012

(30) Foreign Application Priority Data

Jul. 7, 2010 (JP) ................. 2010-154509

(51) Int. Cl.
*H01L 21/02* (2006.01)
*H01L 21/67* (2006.01)

(52) U.S. Cl.
CPC .... *H01L 21/67028* (2013.01); *H01L 21/02052* (2013.01); *H01L 21/67051* (2013.01)

(58) Field of Classification Search
None
See application file for complete search history.

(56) References Cited

U.S. PATENT DOCUMENTS

| | | | |
|---|---|---|---|
| 5,882,433 A | 3/1999 | Ueno | 134/31 |
| 6,261,377 B1 | 7/2001 | Mertens et al. | |
| 6,334,902 B1 | 1/2002 | Mertens et al. | |
| 6,398,975 B1 | 6/2002 | Mertens et al. | |
| 2001/0022186 A1 | 9/2001 | Mertens et al. | |
| 2001/0042559 A1 | 11/2001 | Mertens et al. | |
| 2002/0125212 A1 | 9/2002 | Mertens et al. | |
| 2002/0130106 A1 | 9/2002 | Mertens et al. | |
| 2002/0148483 A1 | 10/2002 | Mertens et al. | |
| 2004/0045589 A1 | 3/2004 | Mertens et al. | |
| 2006/0048792 A1 | 3/2006 | Nakamura et al. | |
| 2006/0081269 A1 | 4/2006 | Kim et al. | |
| 2006/0152694 A1 | 7/2006 | Yasuda et al. | 355/27 |
| 2006/0219264 A1* | 10/2006 | Miya | 134/21 |
| 2007/0131256 A1 | 6/2007 | Nanba et al. | |
| 2007/0277930 A1 | 12/2007 | Yokoyama et al. | 156/345.31 |
| 2008/0053487 A1 | 3/2008 | Goto et al. | 134/32 |
| 2008/0190455 A1* | 8/2008 | Kinoshita et al. | 134/21 |
| 2008/0251101 A1 | 10/2008 | Ohno et al. | |
| 2008/0308131 A1* | 12/2008 | Kim et al. | 134/30 |
| 2008/0314870 A1 | 12/2008 | Inoue et al. | 216/38 |
| 2009/0073394 A1 | 3/2009 | Miyagi et al. | 355/27 |
| 2009/0074402 A1* | 3/2009 | Miyagi et al. | 396/611 |
| 2009/0130614 A1 | 5/2009 | Ookouchi et al. | |

(Continued)

FOREIGN PATENT DOCUMENTS

| | | |
|---|---|---|
| JP | 9-38595 | 2/1997 |
| JP | 11-233481 | 8/1999 |

(Continued)

*Primary Examiner* — Nicole Blan
(74) *Attorney, Agent, or Firm* — Ostrolenk Faber LLP

(57) ABSTRACT

A substrate rotates, and a liquid nozzle of a gas/liquid supply nozzle moves to a position above the center of the rotating substrate. In this state, a rinse liquid is discharged from the liquid nozzle onto the rotating substrate. The gas/liquid supply nozzle moves toward a position outside the substrate. A gas nozzle reaches the position above the center of the rotating substrate, so that the gas/liquid supply nozzle temporarily stops. With the gas/liquid supply nozzle stopping, an inert gas is discharged onto the center of the rotating substrate for a given period of time. After that, the gas/liquid supply nozzle again moves toward the position outside the substrate.

6 Claims, 15 Drawing Sheets

(56) References Cited

U.S. PATENT DOCUMENTS

| | | |
|---|---|---|
| 2009/0250079 A1* | 10/2009 | Yoshihara et al. ............... 134/4 |
| 2009/0272407 A1 | 11/2009 | Nakamura et al. |
| 2010/0136257 A1 | 6/2010 | Yasuda et al. ............... 427/553 |
| 2010/0206338 A1 | 8/2010 | Kraus et al. .................... 134/30 |
| 2010/0330508 A1 | 12/2010 | Ookouchi et al. |
| 2011/0155193 A1 | 6/2011 | Nanba et al. |
| 2011/0168213 A1 | 7/2011 | Kraus et al. ................. 134/94.1 |
| 2012/0234362 A1 | 9/2012 | Yoshihara et al. ............. 134/33 |

FOREIGN PATENT DOCUMENTS

| | | |
|---|---|---|
| JP | 2001-053051 | 2/2001 |
| JP | 2002-057088 | 2/2002 |
| JP | 2005-210059 | 8/2005 |
| JP | 3694641 | 9/2005 |
| JP | 2006-080315 | 3/2006 |
| JP | 2006-114884 A | 4/2006 |
| JP | 2006-245381 | 9/2006 |
| JP | 2006-310732 | 11/2006 |
| JP | 2007-81311 | 3/2007 |
| JP | 2008-60103 | 3/2008 |
| JP | 2009-71026 | 4/2009 |
| JP | 2009-071028 | 4/2009 |
| JP | 4324527 | 9/2009 |
| JP | 2009-231618 | 10/2009 |
| JP | 2009-252855 | 10/2009 |
| JP | 2009-260034 | 11/2009 |
| JP | 2011-501393 | 1/2011 |
| KR | 10-2005-0035318 | 4/2005 |
| KR | 10-2006-0034640 | 4/2006 |
| KR | 10-2006-0037276 | 5/2006 |
| KR | 10-2009-0105815 | 10/2009 |
| WO | 99/16109 | 4/1999 |
| WO | WO 2006/082780 A1 | 8/2006 |

* cited by examiner

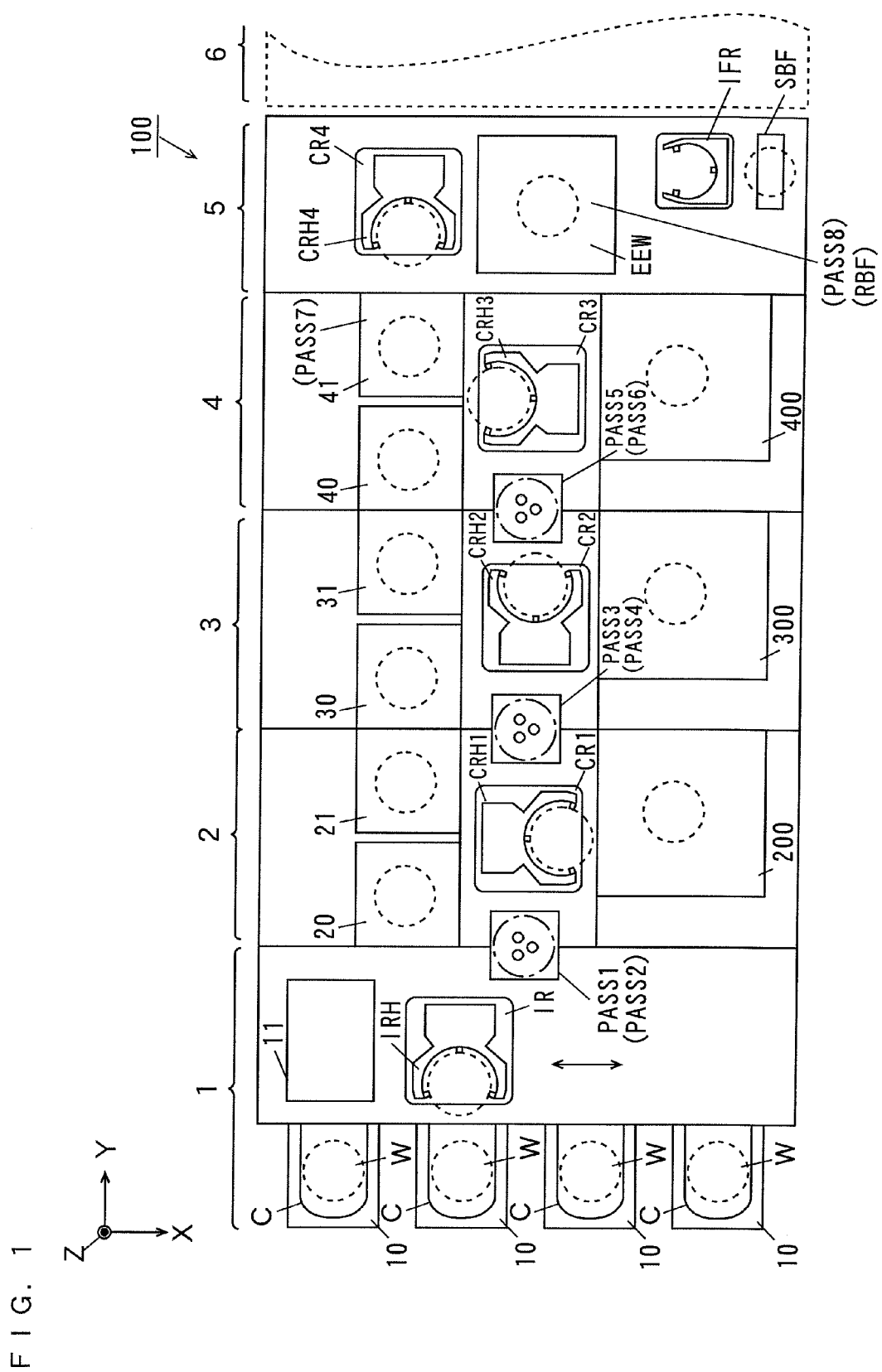
F I G. 1

F I G. 1 5
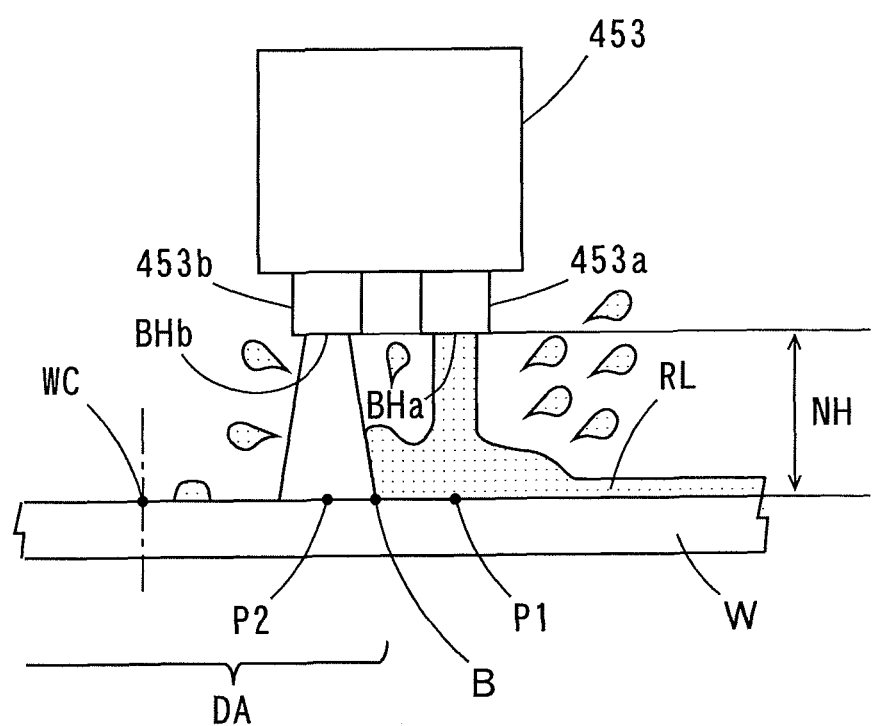

SUBSTRATE CLEANING METHOD AND SUBSTRATE CLEANING DEVICE

BACKGROUND OF THE INVENTION

1. Field of the Invention

The present invention relates to a substrate cleaning method and a substrate cleaning device for subjecting a substrate to predetermined processing.

2. Description of the Background Art

In photolithographic processes in manufacturing processes of semiconductor devices, liquid crystal displays and so on, resist films are first formed on substrates. The resist films formed on the substrates are subsequently exposed in predetermined patterns. The substrates that have been subjected to exposure processing are then subjected to development processing, so that resist patterns are formed on the substrates.

A developing device is used for performing the foregoing development processing. The developing device includes a spin chuck that horizontally holds the substrate and rotates the substrate around an axis in a top-to-bottom direction, a developing liquid nozzle that supplies a developing liquid to the substrate and a rinse liquid nozzle that supplies a rinse liquid to the substrate. During the development processing, the developing liquid nozzle moves from outside of the substrate to a position above the center of the substrate while discharging the developing liquid with the substrate rotated by the spin chuck (see JP 2005-210059 A, for example).

In this case, the developing liquid is supplied onto the entire substrate, and a liquid layer of the developing liquid is formed to cover the resist film on the substrate. In the state, dissolution reaction of the resist film on the substrate proceeds. Then, the rinse liquid nozzle moves to the position above the center of the substrate so as to replace the developing liquid nozzle, and discharges the rinse liquid for a predetermined period of time. This causes the developing liquid on the substrate to be removed. When the supply of the rinse liquid onto the substrate is stopped, the substrate is rotated at high speed by the spin chuck, thereby causing the liquid on the substrate to be shaken off (spin drying).

Circuit patterns required for manufacturing a semiconductor device are exposed on the substrate with the liquid layer of the developing liquid formed thereon. Therefore, after the dissolution reaction of the resist film on the substrate proceeds, there exist both portions on which a resist pattern is formed and portions on which a resist pattern is not formed. In this case, a surface of the portion on which the resist pattern is formed has hydrophilicity, and a surface of the portion on which the resist pattern is not formed has hydrophobicity.

Therefore, a drying time differs in the portion having hydrophilicity (hydrophilic portion) and the portion having hydrophobicity (hydrophobic portion) during the spin drying, and the rinse liquid may remain on the hydrophilic portion although the hydrophobic portion is dried.

In this case, droplets of the rinse liquid shaken off from the hydrophilic portion adhere to the dried hydrophobic portion. It is difficult to shake off fine droplets adhering to the hydrophobic portion by a centrifugal force. As a result, when the substrate is unevenly dried with remaining fine droplets after the spin drying, reaction products such as water marks are produced, leading to processing defects of the substrate.

BRIEF SUMMARY OF THE INVENTION

An object of the present invention is to provide a substrate cleaning method and a substrate cleaning device capable of preventing processing defects of a substrate from being caused by a rinse liquid adhering to the substrate.

(1) According to an aspect of the present invention, a substrate cleaning method for cleaning and drying a substrate includes the steps of rotating the substrate around an axis perpendicular to the substrate while substantially horizontally holding the substrate, discharging a rinse liquid onto the center of the substrate that rotates using a first nozzle that discharges the rinse liquid, moving the first nozzle such that a position on the substrate that receives the rinse liquid discharged from the first nozzle moves from the center of the substrate toward a peripheral edge of the substrate by a given distance, forming a dry region at the center of the substrate by discharging a gas onto the center of the substrate for a given period of time using a second nozzle that discharges the gas while holding a state where the position on the substrate that receives the rinse liquid is spaced apart from the center of the substrate by the given distance, and after the dry region is formed at the center of the substrate, moving the first nozzle such that the position on the substrate that receives the rinse liquid is continuously moved toward the peripheral edge of the substrate and continuously moving the second nozzle such that a position on the substrate that receives the gas discharged from the second nozzle follows a movement path of the position on the substrate that receives the rinse liquid while being spaced apart from the position on the substrate that receives the rinse liquid by the given distance.

In the substrate cleaning method, the substrate is rotated around the axis perpendicular to the substrate while being substantially horizontally held. The rinse liquid is discharged from the first nozzle onto the center of the rotating substrate. The rinse liquid discharged onto the center of the rotating substrate spreads toward the peripheral edge of the substrate, so that a liquid layer is formed on the entire surface of the substrate.

Next, the position on the substrate that receives the rinse liquid discharged from the first nozzle is moved from the center of the substrate toward the peripheral edge of the substrate by the given distance. The gas is discharged from the second nozzle to the center of the substrate for the given period of time while the state where the position on the substrate that receives the rinse liquid is spaced apart from the center of the substrate by the given distance is held, so that the dry region is formed at the center of the substrate. This causes a boundary to be stably formed between the liquid layer of the rinse liquid and the dry region.

After that, the position on the substrate that receives the rinse liquid is continuously moved toward the peripheral edge of the substrate, and the position on the substrate that receives the gas discharged from the second nozzle is continuously moved to follow the position on the substrate that receives the rinse liquid while being spaced apart from the position on the substrate that receives the rinse liquid by the given distance.

The surface of the substrate is forcibly dried in the position on the substrate that receives the gas discharged from the second nozzle. Thus, the rinse liquid is reliably removed from the position on the substrate that receives the gas even when the surface of the substrate includes a portion having hydrophilicity and the portion having hydrophobicity.

The rinse liquid discharged onto the substrate flows toward the peripheral edge of the substrate because of a centrifugal force. Therefore, the position on the substrate that receives the gas discharged from the second nozzle is moved to follow the movement path of the position on the substrate that receives the rise liquid, so that the dry region formed at the center of the substrate is enlarged from the center of the substrate toward the peripheral edge while the boundary is stably formed between the liquid layer of the rinse liquid and the dry region. In this manner, the liquid layer of the rinse liquid is reliably formed outside the dry region formed on the substrate. This prevents a region on the substrate excluding the dry region from being dried because of the centrifugal force.

Accordingly, the substrate is reliably prevented from being unevenly dried. This prevents processing defects of the substrate from being caused by a liquid adhering to the cleaned substrate.

(2) The step of rotating the substrate may include the step of gradually or continuously changing a rotational speed of the substrate such that the substrate rotates at a first rotational speed with the position on the substrate that receives the rinse liquid located at the center of the substrate and the substrate rotates at a second rotational speed that is lower than the first rotational speed with the position on the substrate that receives the rinse liquid located at the peripheral edge of the substrate.

The peripheral speed at the peripheral edge of the rotating substrate is higher than the peripheral speed at the center of the substrate. Therefore, the centrifugal force exerted on the rinse liquid discharged onto the peripheral edge of the substrate is larger than the centrifugal force exerted on the rinse liquid discharged onto the center of the substrate. An excessively large centrifugal force exerted on the rinse liquid makes it difficult to cause the rinse liquid and the gas discharged onto the substrate to stably interact with each other. Meanwhile, an excessively small centrifugal force exerted on the rinse liquid increases interaction between the rinse liquid and the gas discharged onto the substrate, so that the rinse liquid may easily splash from the surface of the substrate.

Therefore, the rotational speed of the substrate with the rinse liquid discharged onto the peripheral edge of the substrate is set lower than the rotational speed of the substrate with the rinse liquid discharged onto the center of the substrate, so that the boundary is stably formed between the liquid layer of the rinse liquid and the dry region, and the rinse liquid is unlikely to splash on the substrate.

(3) The given distance may be not less than 12 mm and not more than 22 mm.

In this case, the distance between the position on the substrate that receives the gas discharged from the second nozzle and the position on the substrate that receives the rinse liquid is not less than 12 mm, thereby preventing the rinse liquid and the gas discharged onto the substrate from excessively interacting with each other. Accordingly, the boundary can be stably formed between the liquid layer of the rinse liquid and the dry region, and the rinse liquid can be unlikely to splash on the substrate.

The distance between the position on the substrate that receives the gas discharged from the second nozzle and the position on the substrate that receives the rinse liquid is not more than 22 mm, so that the rinse liquid and the gas discharged onto the substrate can reliably interact with each other.

(4) The first nozzle may have a first discharge port from which the rinse liquid is discharged, the second nozzle may have a second discharge port from which the gas is discharged, and a height from the surface of the substrate to the first discharge port and a height from the surface of the substrate to the second discharge port may be each not less than 10 mm and not more than 40 mm.

In this case, the height from the surface of the substrate to the discharge port of the first nozzle and the height from the surface of the substrate to the discharge port of the second nozzle are each not less than 10 mm, thereby preventing the rinse liquid and the gas discharged onto the substrate from excessively interacting with each other. Accordingly, the boundary can be stably formed between the liquid layer of the rinse liquid and the dry region, and the rinse liquid can be unlikely to splash on the substrate.

The height from the surface of the substrate to the discharge port of the first nozzle and the height from the surface of the substrate to the discharge port of the second nozzle are each not more than 40 mm, thereby preventing the rinse liquid and the gas discharged onto the substrate from being affected by airflow to be generated in a space above the substrate. This allows the boundary to be stably formed between the liquid layer of the rinse liquid and the dry region.

(5) An inner diameter of each of the first and second discharge ports may be not less than 2 mm and not more than 6 mm.

In this case, the rinse liquid and the gas discharged onto the substrate can reliably interact with each other, and the boundary can be stably formed between the liquid layer of the rinse liquid and the dry region.

(6) A flow rate of the rinse liquid discharged from the first discharge port may be not less than 150 mL/min and not more than 800 mL/min, and a flow rate of the gas discharged from the second discharge port may be not less than 10 L/min and not more than 40 L/min.

In this case, the flow rate of the rinse liquid is not less than 150 mL/min, thereby reliably causing the rinse liquid and the gas discharged onto the substrate to interact with each other. The flow rate of the rinse liquid is not more than 800 mL/min, thereby preventing the rinse liquid and the gas discharged onto the substrate from excessively interacting with each other. Accordingly, the boundary can be stably formed between the liquid layer of the rinse liquid and the dry region, and the rinse liquid can be unlikely to splash on the substrate.

Furthermore, the flow rate of the gas is not less than 10 L/min, thereby reliably causing the rinse liquid and the gas discharged onto the substrate to interact with each other. The flow rate of the gas is not more than 40 L/min, thereby preventing the rinse liquid and the gas discharged onto the substrate from excessively interacting with each other. Accordingly, the boundary can be stably formed between the liquid layer of the rinse liquid and the dry region, and the rinse liquid can be unlikely to splash on the substrate.

(7) According to another aspect of the present invention, a substrate cleaning device arranged to clean and dry a substrate includes a substrate holder arranged to substantially horizontally hold the substrate, a rotation driver arranged to rotate the substrate held by the substrate holder around an axis perpendicular to the substrate, a first nozzle arranged to discharge a rinse liquid onto the substrate that rotates, a first nozzle moving mechanism arranged to move the first nozzle, a second nozzle arranged to discharge a gas onto the substrate that rotates, a second nozzle moving mechanism arranged to move the second nozzle, and a controller arranged to control the substrate holder, the rotation driver, the first nozzle moving mechanism and the second nozzle moving mechanism, wherein the controller causes the rotation driver to rotate the substrate around the axis perpendicular to the substrate while substantially horizontally holding the substrate, causes the first nozzle to discharge the rinse liquid onto the center of the substrate that rotates, causes the first nozzle moving mechanism to move the first nozzle such that a position on the substrate that receives the rinse liquid discharged from the first nozzle moves from the center of the substrate toward a peripheral edge of the substrate by a given distance, forms a dry region at the center of the substrate by causing the second nozzle to discharge the gas onto the center of the substrate for a given period of time while holding a state where the position on the substrate that receives the rinse liquid is spaced apart from the center of the substrate by the given distance, and after the dry region is formed at the center of the substrate, causes the first nozzle moving mechanism to move the first nozzle such that the position on the substrate that receives the rinse liquid is continuously moved toward the peripheral edge of the substrate and causes the second nozzle moving mechanism to continuously move the second nozzle such that a position on the substrate that receives the gas discharged from the second nozzle follows a movement path of the position on the substrate that receives the rinse liquid while being spaced apart from the position on the substrate that receives the rinse liquid by the given distance.

In the substrate cleaning device, the substrate is rotated around the axis perpendicular to the substrate while being substantially horizontally held by the rotation driver. The rinse liquid is discharged from the first nozzle onto the center of the rotating substrate. The rinse liquid discharged onto the center of the rotating substrate spreads toward the peripheral edge of the substrate, so that the liquid layer is formed on the entire surface of the substrate.

Next, the first nozzle is moved by the first nozzle moving mechanism such that the position on the substrate that receives the rinse liquid discharged from the first nozzle moves from the center of the substrate toward the peripheral edge of the substrate by the given distance. The gas is discharged from the second nozzle onto the center of the substrate for the given period of time while a state where the position on the substrate that receives the rinse liquid is spaced apart from the center of the substrate by the given distance is held, so that the dry region is formed at the center of the substrate. Accordingly, the boundary is stably formed between the liquid layer of the rinse liquid and the dry region.

After that, the first nozzle is moved by the first nozzle moving mechanism such that the position on the substrate that receives the rinse liquid is continuously moved toward the peripheral edge of the substrate, and the second nozzle is moved by the second nozzle moving mechanism such that the position on the substrate that receives the gas discharged from the second nozzle is continuously moved to follow the movement path of the position on the substrate that receives the rinse liquid while being spaced apart from the position on the substrate that receives the rinse liquid by the given distance.

The surface of the substrate is forcibly dried in the position on the substrate that receives the gas discharged from the second nozzle. Therefore, the rinse liquid is reliably removed from the position on the substrate that receives the gas even when the surface of the substrate includes a portion having hydrophilicity and a portion having hydrophobicity.

The rinse liquid discharged onto the substrate flows toward the peripheral edge of the substrate because of a centrifugal force. Therefore, the position on the substrate that receives the gas discharged from the second nozzle is moved to follow the movement path of the position on the substrate that receives the rinse liquid, so that the dry region formed at the center of the substrate is enlarged from the center of the substrate toward the peripheral edge while the boundary is stably formed between the liquid layer of the rinse liquid and the dry region. In this manner, the liquid layer of the rinse liquid is reliably formed outside the dry region formed on the substrate. This prevents a region on the substrate excluding the dry region from being dried because of the centrifugal force.

Accordingly, the substrate is reliably prevented from being unevenly dried. This prevents processing defects of the substrate from being caused by a liquid adhering to the cleaned substrate.

(8) The controller may gradually or continuously change a rotational speed of the substrate by the rotation driver such that the substrate rotates at a first rotational speed with the position on the substrate that receives the rinse liquid located at the center of the substrate and the substrate rotates at a second rotational speed that is lower than the first rotational speed with the position on the substrate that receives the rinse liquid located at the peripheral edge of the substrate.

The peripheral speed at the peripheral edge of the rotating substrate is higher than the peripheral speed at the center of the substrate. Therefore, the centrifugal force exerted on the rinse liquid discharged onto the peripheral edge of the substrate is larger than the centrifugal force exerted on the rinse liquid discharged onto the center of the substrate. An excessively large centrifugal force exerted on the rinse liquid makes it difficult to cause the rinse liquid and the gas discharged onto the substrate to stably interact with each other. Meanwhile, an excessively small centrifugal force exerted on the rinse liquid causes the rinse liquid and the gas discharged onto the substrate to interact with each other, so that the rinse liquid may easily splash from the surface of the substrate.

Therefore, the rotational speed of the substrate with the rinse liquid discharged onto the peripheral edge of the substrate is set lower than the rotational speed of the substrate with the rinse liquid discharged onto the center of the substrate, so that the boundary is stably formed between the liquid layer of the rinse liquid and the dry region, and the rinse liquid is unlikely to splash on the substrate.

(9) The given distance may be not less than 12 mm and not more than 22 mm.

In this case, the distance between the position on the substrate that receives the gas discharged from the second nozzle and the position on the substrate that receives the rinse liquid is not less than 12 mm, thereby preventing the rinse liquid and the gas discharged onto the substrate from excessively interacting with each other. Accordingly, the boundary can be stably formed between the liquid layer of the rinse liquid and the dry region, and the rinse liquid can be unlikely to splash on the substrate.

The distance between the position on the substrate that receives the gas discharged from the second nozzle and the position on the substrate that receives the rinse liquid is not more than 22 mm, so that the rinse liquid and the gas discharged onto the substrate can reliably interact with each other.

(10) The substrate cleaning device may further include a holder that holds the first nozzle and the second nozzle, wherein the first nozzle may have a first discharge port from which the rinse liquid is discharged, the second nozzle may have a second discharge port from which the gas is discharged, and the holder may hold the first nozzle and the second nozzle such that a height from the surface of the substrate to the first discharge port and a height from the surface of the substrate to the second discharge port are each not less than 10 mm and not more than 40 mm.

In this case, the height from the surface of the substrate to the discharge port of the first nozzle and the height from the surface of the substrate to the discharge port of the second nozzle are each not less than 10 mm, thereby preventing the rinse liquid and the gas discharged onto the substrate from excessively interacting with each other. Accordingly, the boundary can be stably formed between the liquid layer of the rinse liquid and the dry region, and the rinse liquid can be unlikely to splash on the substrate.

The height from the surface of the substrate to the discharge port of the first nozzle and the height from the surface of the substrate to the discharge port of the second nozzle are each not more than 40 mm, thereby preventing the rinse liquid and the gas discharged onto the substrate from being affected by airflow to be generated in a space above the substrate. This allows the boundary to be stably formed between the liquid layer of the rinse liquid and the dry region.

(11) An inner diameter of each of the first and second discharge ports may be not less than 2 mm and not more than 6 mm.

In this case, the rinse liquid and the gas discharged onto the substrate can reliably interact with each other, and the boundary can be stably formed between the liquid layer of the rinse liquid and the dry region.

(12) A flow rate of the rinse liquid discharged from the first discharge port may be not less than 150 mL/min and not more than 800 mL/min, and a flow rate of the gas discharged from the second discharge port may be not less than 10 L/min and not more than 40 L/min.

In this case, the flow rate of the rinse liquid is not less than 150 mL/min, thereby causing the rinse liquid and the gas discharged onto the substrate to reliably interact with each other. The flow rate of the rinse liquid is not more than 800 mL/min, thereby preventing the rinse liquid and the gas discharged onto the substrate from excessively interacting with each other. Accordingly, the boundary can be stably formed between the liquid layer of the rinse liquid and the dry region, and the rinse liquid can be unlikely to splash on the substrate.

Furthermore, the flow rate of the gas is not less than 10 L/min, thereby reliably causing the rinse liquid and the gas discharged onto the substrate to interact with each other. The flow rate of the gas is not more than 40 L/min, thereby preventing the rinse liquid and the gas discharged onto the substrate from excessively interacting with each other. Accordingly, the boundary can be stably formed between the liquid layer of the rinse liquid and the dry region, and the rinse liquid can be unlikely to splash on the substrate.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

FIG. 1 is a plan view of a substrate processing apparatus according to one embodiment of the present invention;

FIG. 15 is a side view for explaining effects of the height of the gas/liquid supply nozzle from a surface of the substrate on formation of the boundary.

DETAILED DESCRIPTION OF THE INVENTION

Figure 2:
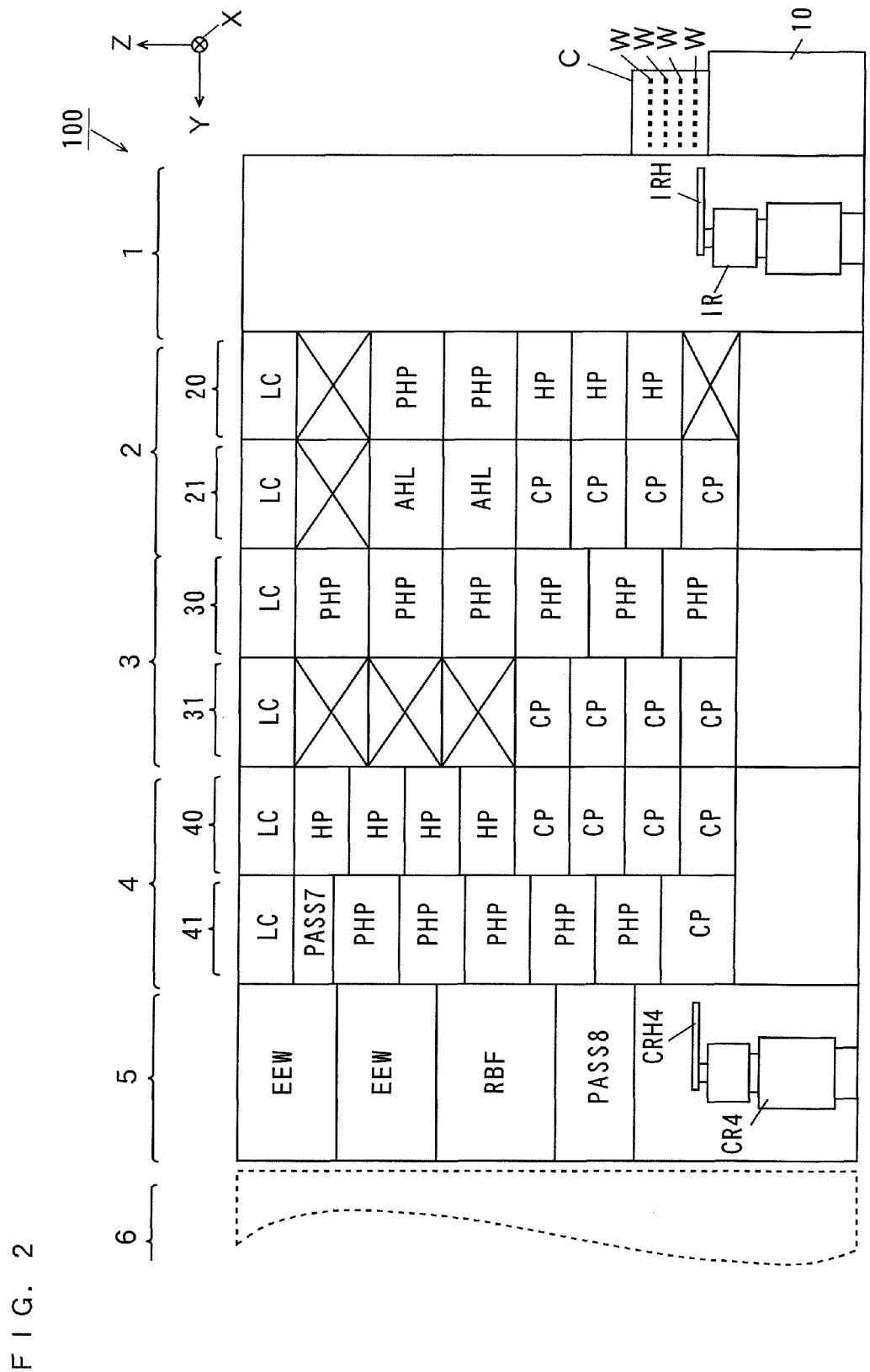
FIG. 2 is a schematic view of one side of the substrate processing apparatus of FIG. 1.

Description will be made of a substrate cleaning method and a substrate cleaning device according to one embodiment of the present invention while referring to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask or the like.

The substrate cleaning method according to the one embodiment of the present invention is used in a substrate processing apparatus described below. In the following paragraphs, description will be made of a development processing device provided in the substrate processing apparatus as one example of the substrate cleaning device.

(1) Configuration of the Substrate Processing Apparatus

Figure 3:
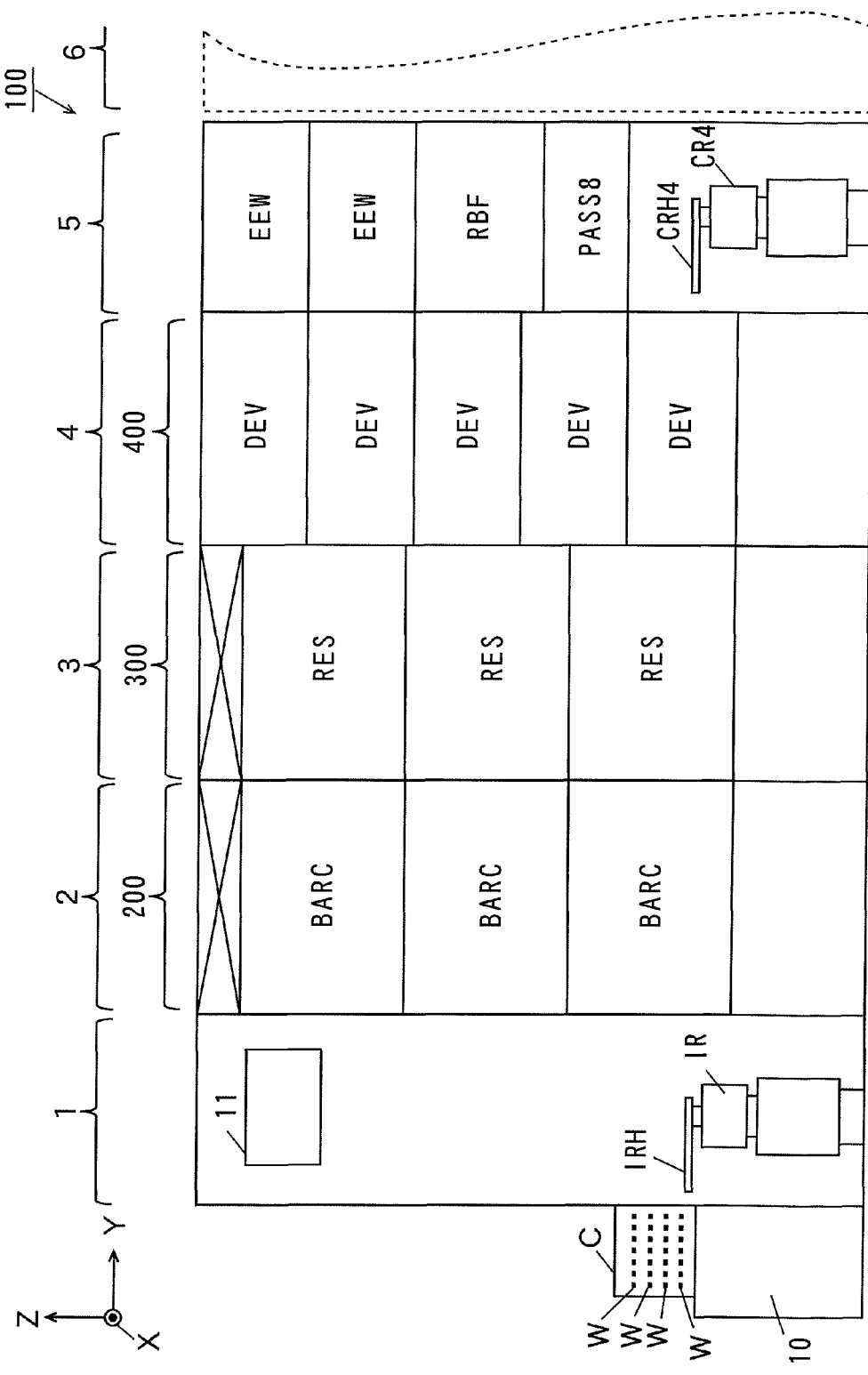
FIG. 3 is a schematic view of the other side of the substrate processing apparatus of FIG. 1.

FIG. 1 is a plan view of the substrate processing apparatus according to one embodiment of the present invention. FIG. 1 and FIGS. 2 and 3 described below are accompanied by arrows that respectively indicate X, Y, and Z directions perpendicular to one another for clarity of a positional relationship. The X and Y directions are perpendicular to each other within a horizontal plane, and the Z direction corresponds to a top-to-bottom direction. In each of the directions, the direction of the arrow is defined as a + direction, and the opposite direction is defined as a − direction.

As shown in FIG. 1, the substrate processing apparatus 100 includes an indexer block 1, an processing block 2 for anti-reflection film, a processing block 3 for resist film, a block 4 for development processing and an interface block 5. An exposure device 6 is arranged adjacent to the interface block 5.

Hereinafter, each of the indexer block 1, the processing block 2 for anti-reflection film, the processing block 3 for resist film, the block 4 for development processing and the interface block 5 is referred to as a processing block.

The indexer block 1 includes a plurality of carrier platforms 10, a main controller 11 and an indexer robot IR. The main controller 11 is composed of a CPU (Central Processing Unit) and a memory, or composed of a microcomputer, for example. The main controller 11 controls an operation of each component in the substrate processing apparatus 100. The indexer robot IR is provided with a hand IRH for receiving and transferring the substrate W.

The processing block 2 for anti-reflection film includes thermal processing groups 20, 21 for anti-reflection film, a coating processing group 200 for anti-reflection film and a first central robot CR1. The coating processing group 200 for anti-reflection film is provided opposite to the thermal processing groups 20, 21 for anti-reflection film with the first central robot CR1 therebetween. The first central robot CR1 is provided with a hand CRH1 for receiving and transferring the substrate W.

The processing block 3 for resist film includes thermal processing groups 30, 31 for resist film, a coating processing group 300 for resist film and a second central robot CR2. The coating processing group 300 for resist film is provided opposite to the thermal processing groups 30, 31 for resist film with the second central robot CR2 therebetween. The second central robot CR2 is provided with a hand CRH2 for receiving and transferring the substrate W.

The block 4 for development processing includes thermal processing groups 40, 41 for development, a development processing group 400 and a third central robot CR3. The development processing group 400 is provided opposite to the thermal processing groups 40, 41 for development with the third central robot CR3 therebetween. The third central robot CR3 is provided with a hand CRH3 for receiving and transferring the substrate W.

The interface block 5 includes a fourth central robot CR4, a sending buffer SBF, a return buffer RBF, a transport mechanism IFR for interface and edge exposure units EEW. The fourth central robot CR4 is provided with a hand CRH4 for receiving and transferring the substrate W. The transport mechanism IFR for interface receives and transfers the substrate W between a substrate platform PASS8 and the exposure device 6, described below.

In the substrate processing apparatus 100 according to the present embodiment, the indexer block 1, the processing block 2 for anti-reflection film, the processing block 3 for resist film, the block 4 for development processing and the interface block 5 are arranged to line up in this order.

Respective partition walls are provided between adjacent processing blocks. Each partition wall has two of substrate platforms PASS1 to PASS6 arranged close to each other in the top-to-bottom direction for receiving and transferring the substrate W between adjacent processing blocks.

The thermal processing group 41 for development in the block 4 for development processing is provided with a substrate platform PASS7 as described below. In addition, the substrate platform PASS8 is provided below the edge exposure units EEW in the interface block 5. Each of the substrate platforms PASS1 to PASS8 is provided with a plurality of support pins that are fixed thereto. Each of the substrate platforms PASS1 to PASS8 is provided with an optical sensor (not shown) that detects the presence/absence of the substrate W. This allows for determination as to whether or not the substrate W is placed on the substrate platforms PASS1 to PASS8.

The substrate platforms PASS1, PASS3, PASS5 are used for receiving and transferring unprocessed substrates W, and the substrate platforms PASS2, PASSS4, PASS6 are used for receiving and transferring processed substrates W.

FIG. 2 is a schematic view of one side of the substrate processing apparatus 100 of FIG. 1, and FIG. 3 is a schematic view of the other side of the substrate processing apparatus 100 of FIG. 1. FIG. 2 mainly shows the configuration on one side of the substrate processing apparatus 100, and FIG. 3 mainly shows the configuration on the other side of the substrate processing apparatus 100.

First, description is made of the configuration of the substrate processing apparatus 100 by referring to FIG. 2. As shown in FIG. 2, the thermal processing group 20 for anti-reflection film in the processing block 2 for anti-reflection film includes a vertical stack of two thermal processing units PHP with interfaces (hereinafter simply referred to as thermal processing units) and three hot plates HP, and the thermal processing group 21 for anti-reflection film includes a vertical stack of two adhesion agent coating processing units AHL and four cooling plates CP. Local controllers LC that control temperatures of the thermal processing units PHP, the hot plates HP, the adhesion agent coating processing units AHL and the cooling plates CP are arranged on respective uppermost portions of the thermal processing groups 20, 21 for anti-reflection film.

The thermal processing group 30 for resist film in the processing block 3 for resist film includes a vertical stack of six thermal processing units PHP, and the thermal processing group 31 for resist film includes a vertical stack of four cooling plates CP. Local controllers LC that control temperatures of the thermal processing units PHP and the cooling plates CP are arranged on respective uppermost portions of the thermal processing groups 30, 31 for resist film.

The thermal processing group 40 for development in the block 4 for development processing includes a vertical stack of four hot plates HP and four cooling plates CP, and the thermal processing group 41 for development includes a vertical stack of the substrate platform PASS7, five thermal processing units PHP and a cooling plate CP. Local controllers LC that control temperatures of the thermal processing units PHP, the hot plates HP and the cooling plates CP are arranged on respective uppermost portions of the thermal processing groups 40, 41 for development.

The interface block 5 includes a vertical stack of the two edge exposure units EEW, the return buffer RBF and the substrate platform PASS8, and includes the sending buffer SBF, the fourth central robot CR4 and the transport mechanism IFR for interface (FIGS. 1 and 3).

Next, description will be made of the configuration of the substrate processing apparatus 100 by referring to FIG. 3. As shown in FIG. 3, the coating processing group 200 for anti-reflection film in the processing block 2 for anti-reflection film has a vertical sack of three coating units BARC. The coating processing group 300 for resist film in the processing block 3 for resist film includes a vertical stack of three coating units RES. The development processing group 400 in the block 4 for development processing includes a vertical stack of five development processing devices DEV.

(2) Operations of the Substrate Processing Apparatus

Description will be made of operations of the substrate processing apparatus 100 while mainly referring to FIG. 1. Carriers C each storing a plurality of substrates W in multiple stages are respectively carried onto the carrier platforms 10 in the indexer block 1. The indexer robot IR takes out an unprocessed substrate W that is stored in the carrier C using the hand IRH for receiving and transferring the substrate W. Thereafter, the indexer robot IR rotates while moving in the ± X directions, and places the unprocessed substrate Won the substrate platform PASS1.

Although FOUPs (Front Opening Unified Pods) are adopted as the carriers C in the present embodiment, the present invention is not limited to this. For example, SMIF (Standard Mechanical Interface) pods, OCs (Open Cassettes) that expose the stored substrates W to outside air, or the like may be used. Furthermore, although linear-type transport robots that move their hands forward and backward by linearly sliding them to the substrate W are respectively used as the indexer robot IR, the first to fourth central robots CR1 to CR4, and the transport mechanism IFR for interface, the present invention is not limited to this. For example, multi-joint type transport robots that linearly move their hands forward and backward by moving their joints may be used.

The unprocessed substrate W placed on the substrate platform PASS1 is received by the hand CRH1 of the first central robot CR1 in the processing block 2 for anti-reflection film. The first central robot CR1 carries the substrate W in the coating processing group 200 for anti-reflection film. In the coating processing group 200 for anti-reflection film, the coating unit BARC (FIG. 3) forms a coating of an anti-reflection film on the substrate W in order to reduce standing waves and halation to be generated during exposure.

The first central robot CR1 then takes out the substrate W after the coating processing from the coating processing group 200 for anti-reflection film and carries the substrate W in the thermal processing groups 20, 21 for anti-reflection film. After a predetermined thermal processing is performed in the thermal processing groups 20, 21 for anti-reflection film, the first central robot CR1 takes out the substrate W after the thermal processing from the thermal processing groups 20, 21 for anti-reflection film and places the substrate W on the substrate platform PASS3.

The substrate W placed on the substrate platform PASS3 is received by the hand CRH2 of the second central robot CR2 in the processing block 3 for resist film. The second central robot CR2 carries the substrate W in the coating processing group 300 for resist film. In the coating processing group 300 for resist film, the coating unit RES (FIG. 3) forms a coating of a photoresist film on the substrate W that has been coated with the anti-reflection film. Thereafter, the second central robot CR2 takes out the substrate W after the coating processing from the coating processing group 300 for resist film and carries the substrate W in the thermal processing groups 30, 31 for resist film. After a predetermined thermal processing is performed in the thermal processing groups 30, 31 for resist film, the second central robot CR2 takes out the substrate W after the thermal processing from the thermal processing groups 30, 31 for resist film, and places the substrate W on the substrate platform PASS5.

The substrate W placed on the substrate platform PASS5 is received by the hand CRH3 of the third central robot CR3 in the block 4 for development processing. The third central robot CR3 places the substrate W on the substrate platform PASS7. The substrate W placed on the substrate platform PASS7 is received by the hand CRH4 of the fourth central robot CR4 in the interface block 5. The fourth central robot CR4 carries the substrate W in the edge exposure unit EEW. After the peripheral edge of the substrate W is subjected to exposure processing (edge exposure processing) in the edge exposure unit EEW, the fourth central robot CR4 takes out the substrate W after the edge exposure processing from the edge exposure unit EEW, and places the substrate W on the substrate platform PASS8 provided below the edge exposure unit EEW.

The substrate W placed on the substrate platform PASS8 is received by the transport mechanism IFR for interface. The transport mechanism IFR for interface carries the substrate W in the exposure device 6.

Here, the exposure processing performed by the exposure device 6 usually takes more time than other processing steps and transporting steps. As a result, the exposure device 6 cannot receive subsequent substrates W in many cases. In this case, the substrate W is temporarily stored in the sending buffer SBF (FIG. 1).

The substrate W is subjected to the exposure processing in the exposure device 6. After that, the transport mechanism IFR for interface receives the substrate W after the exposure processing by the exposure device 6, and places the substrate W on the substrate platform PASS8.

When the block 4 for development processing cannot temporarily receive the substrate W because of a failure of the development processing device DEV (FIG. 3) or the like, the substrate W after the exposure processing can be temporarily stored in the return buffer RBF.

The substrate W placed on the substrate platform PASS8 is received by the hand CRH4 of the fourth central robot CR4 in the interface block 5. The fourth central robot CR4 carries the substrate W in the thermal processing group 41 for development. The substrate W is subjected to a predetermined thermal processing in the thermal processing group 41 for development. After that, the fourth central robot CR4 takes out the substrate W after the thermal processing from the thermal processing group 41 for development, and places the substrate W on the substrate platform PASS7.

The substrate W placed on the substrate platform PASS7 is received by the hand CRH3 of the third central robot CR3 in the block 4 for development processing. The third central robot CR3 carries the substrate W in the development processing group 400. The exposed substrate W is subjected to development processing by the development processing device DEV (FIG. 3) in the development processing group 400. After that, the third central robot CR3 takes out the substrate W from the development processing group 400, and carries the substrate W in the thermal processing group 40 for development. After a predetermined thermal processing is performed in the thermal processing group 40 for development, the third central robot CR3 takes out the substrate W after the thermal processing from the thermal processing group 40 for development, and places the substrate W on the substrate platform PASS6 provided in the processing block 3 for resist film.

The substrate W placed on the substrate platform PASS6 is placed on the substrate platform PASS4 by the second central robot CR2 in the processing block 3 for resist film. The substrate W placed on the substrate platform PASS4 is placed on the substrate platform PASS2 by the first central robot CR1 in the processing block 2 for anti-reflection film.

The substrate W placed on the substrate platform PASS2 is stored in the carrier C by the indexer robot IR in the indexer block 1.

(3) Configuration of the Development Processing Device

Figure 4:
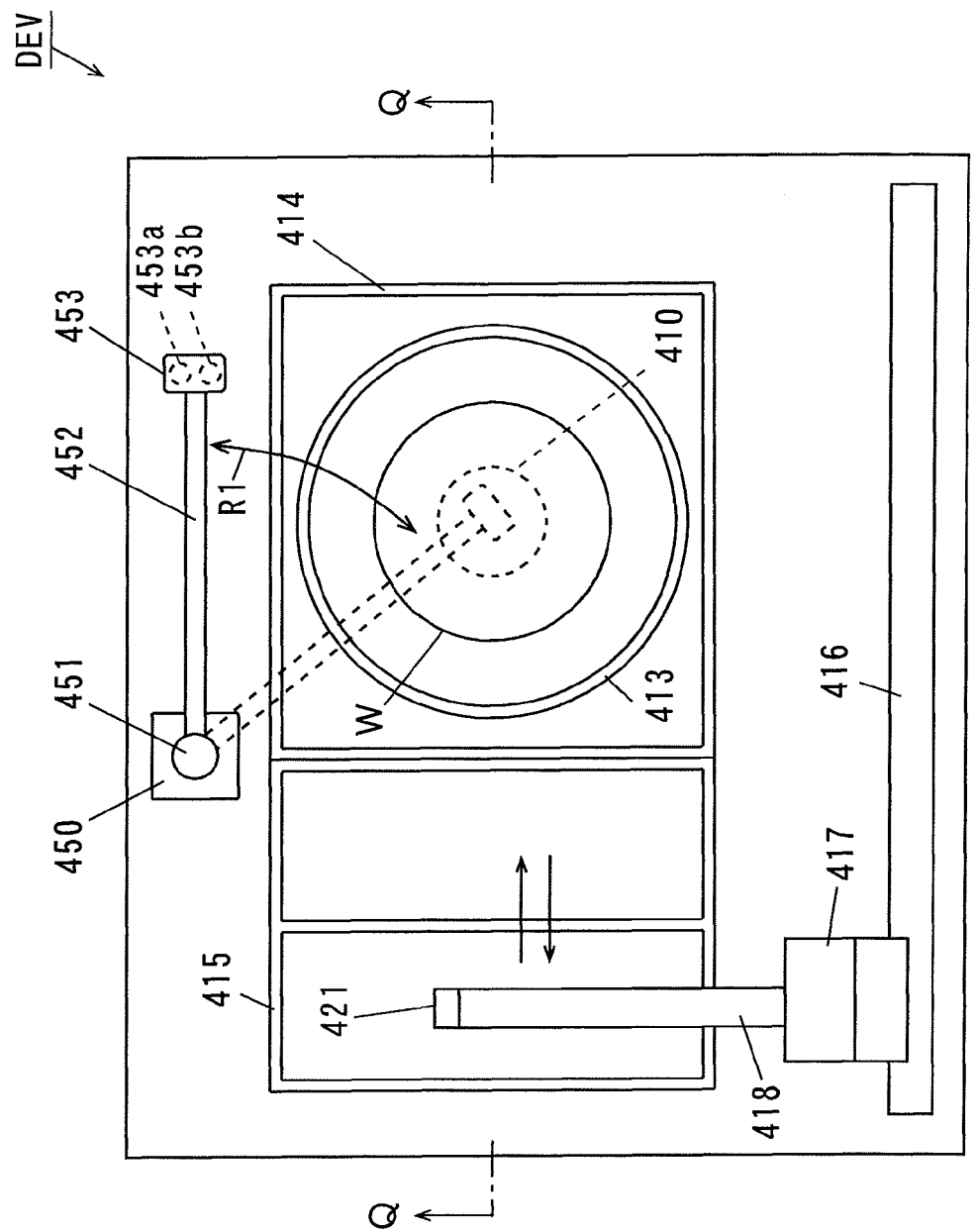
FIG. 4 is a plan view showing the configuration of a development processing device of FIG. 3.

Detailed description will be made of the development processing device DEV of the development processing group 400 of FIG. 3. FIG. 4 is a plan view showing the configuration of the development processing device DEV of FIG. 3, and FIG. 5 is a sectional view of the development processing device DEV taken along the line Q-Q of FIG. 4.

Figure 5:
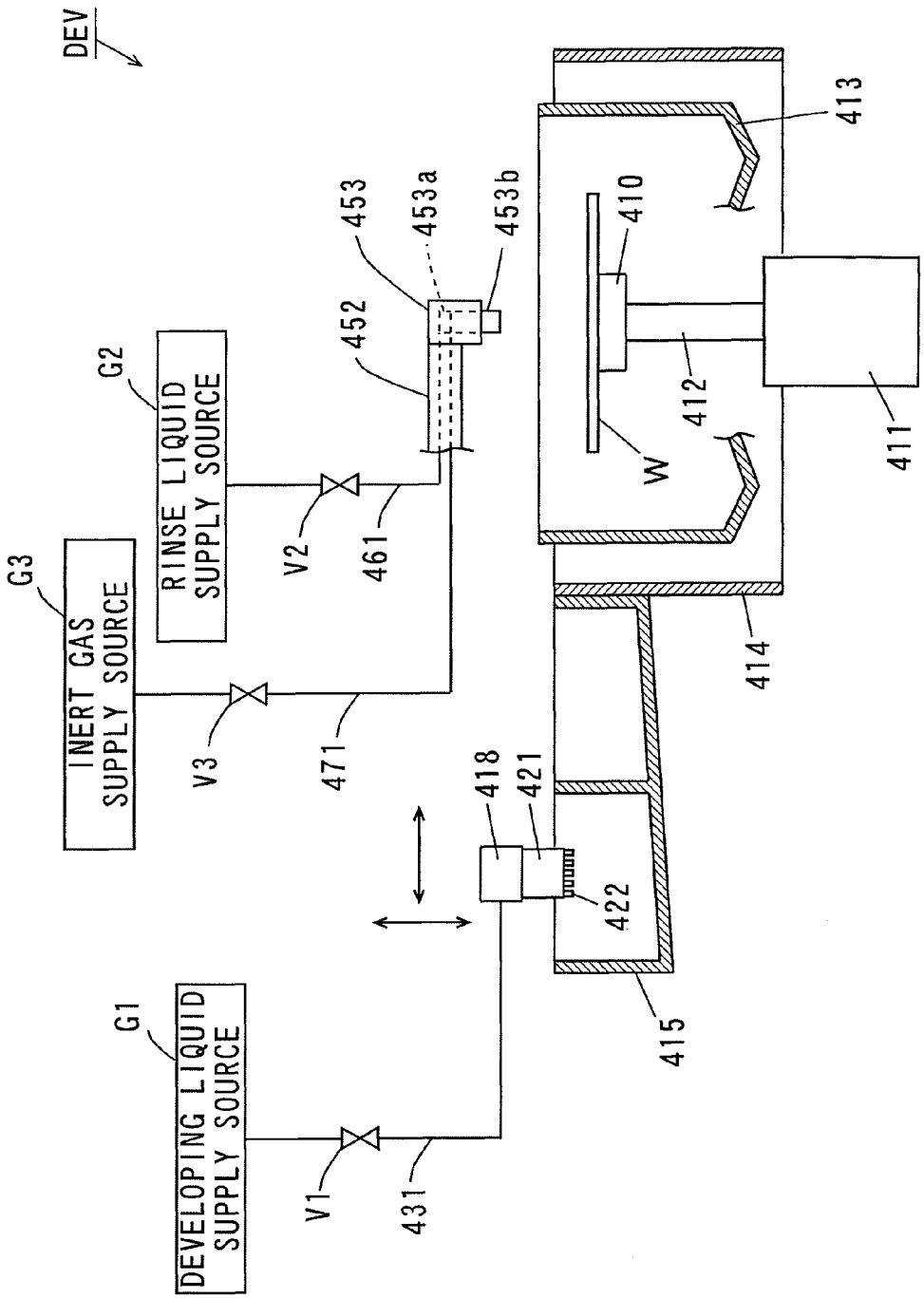
FIG. 5 is a sectional view of the development processing device taken along the line Q-Q of FIG. 4.

As shown in FIGS. 4 and 5, the development processing device DEV includes a spin chuck 410 for holding the substrate W in a horizontal attitude by suction. The spin chuck 410 is fixed to a tip portion of a rotating shaft 412 (FIG. 5) of a motor 411 (FIG. 5), and is rotatable around its axis in the top-to-bottom direction. A circular inner cup 413 is movable up and down around the spin chuck 410 so as to surround the substrate W. A square outer cup 414 is provided to surround the inner cup 413.

As shown in FIG. 4, a waiting pod 415 is provided on the side of the outer cup 414. A guide rail 416 is provided to extend along a direction in which the outer cup 414 and the waiting pod 415 are arranged. An arm driver 417 is movable along the guide rail 416. A nozzle arm 418 that extends in a direction perpendicular to the guide rail 416 in a horizontal plane is attached to the arm driver 417. The nozzle arm 418 is driven by the arm driver 417, and moves in the direction along the guide rail 416 and moves up and down.

A motor 450 is provided in a region on the opposite side to the guide rail 416 with respect to the spin chuck 410. A rotation shaft 451 is connected to the motor 450. A nozzle arm 452 is coupled to the rotation shaft 451 to extend in a horizontal direction, and a gas/liquid supply nozzle 453 is attached to the tip of the nozzle arm 452. The gas/liquid supply nozzle 453 includes a liquid nozzle 453a and a gas nozzle 453b.

The rotation shaft 451 is rotated by the motor 450 to cause the nozzle arm 452 to swing. Thus, the gas/liquid supply nozzle 453 moves between a position above the center of the substrate W held by the spin chuck 410 and a position outside the substrate W (see the arrow R1 of FIG. 4).

As shown in FIG. 5, a developing liquid nozzle 421 having a plurality of (five in this example) developing liquid discharge ports 422 is provided at the tip of the nozzle arm 418. When the substrate W is subjected to the development processing, the nozzle arm 418 is moved, thereby causing the developing liquid nozzle 421 to move from the waiting pod 415 to a position above the substrate W.

The developing liquid nozzle 421 is connected to a developing liquid supply source G1 through a developing liquid supply pipe 431. A valve V1 is provided in the developing liquid supply pipe 431. The developing liquid is supplied from the developing liquid supply source G1 to the developing liquid nozzle 421 by opening the valve V1.

The liquid nozzle 453a of the gas/liquid supply nozzle 453 is connected to a rinse liquid supply source G2 through a rinse liquid supply pipe 461. A valve V2 is provided in the rinse liquid supply pipe 461. The rinse liquid is supplied from the rinse liquid supply source G2 to the liquid nozzle 453a by opening the valve V2.

The gas nozzle 453b of the gas/liquid supply nozzle 453 is connected to an inert gas supply source G3 through an inert gas supply pipe 471. A valve V3 is provided in the inert gas supply pipe 471. An inert gas is supplied from the inert gas supply source G3 to the gas nozzle 453b through the inert gas supply pipe 471 by opening the valve V3.

The foregoing valves V1 to V3 are flow rate adjusting valves. An amount of the developing liquid supplied to the developing liquid nozzle 421, an amount of the rinse liquid supplied to the liquid nozzle 453a, and an amount of the inert gas supplied to the gas nozzle 453b are adjusted by controlling the respective valves V1 to V3.

In the present embodiment, the rinse liquid is pure water, and the inert gas is nitrogen ($N_2$) gas. Examples of the rinse liquid may include pure water, carbonic water, hydrogen water, electrolytic ionic water, HFE (hydrofluoroether), and an organic-based liquid. Examples of the inert gas may include nitrogen ($N_2$) gas, argon gas and helium gas.

Figure 6:
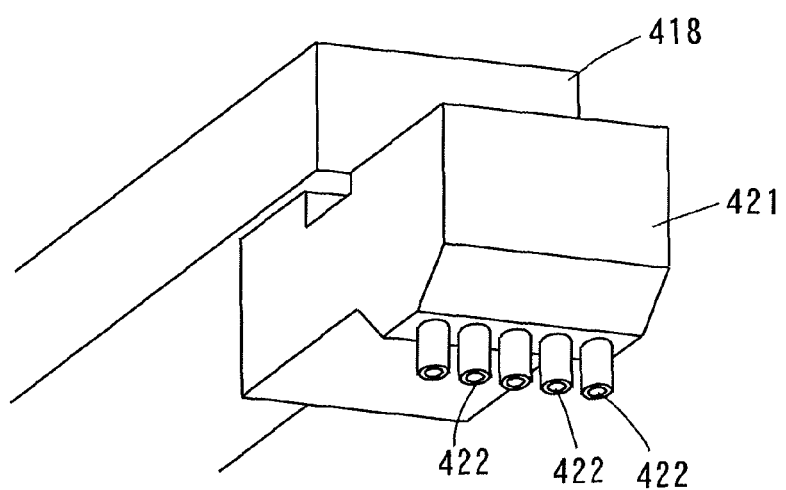
FIG. 6 is a schematic perspective view of a developing liquid nozzle.

Description will be made of the configuration of the developing liquid nozzle 421. FIG. 6 is a schematic perspective view of the developing liquid nozzle 421. As shown in FIG. 6, the developing liquid nozzle 421 is provided with the plurality of developing liquid discharge ports 422 that are directed downward at equal spacings along a width direction (a direction parallel to the guide rail 416 of FIG. 4) of the developing liquid nozzle 421. The developing liquid supplied to the developing liquid nozzle 421 is discharged from the plurality of developing liquid discharge ports 422. Each developing liquid discharge port 422 is arranged to pass the position above the center of the substrate W held on the spin chuck 410 as the developing liquid nozzle 421 moves.

Description will be made of the configuration of the gas/liquid supply nozzle 453. Here, the gas/liquid supply nozzle 453 is attached to the tip of the nozzle arm 452 (FIGS. 4 and 5) as described above.

Figure 7:
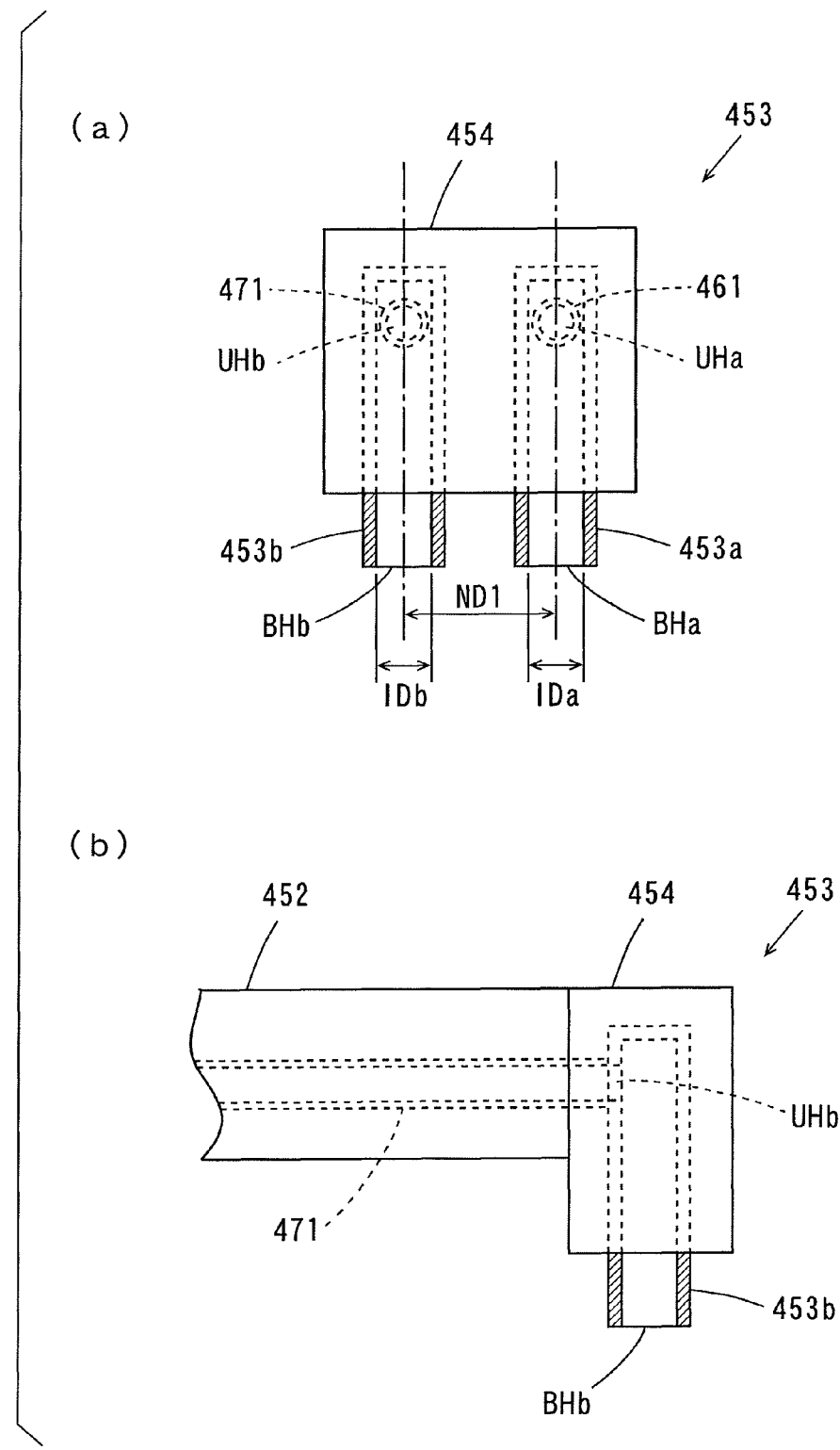
FIG. 7 (a) is a front view of a gas/liquid supply nozzle of FIGS. 4 and 5, and FIG. 7 (b) is a side view of one side of the gas/liquid supply nozzle of FIGS. 4 and 5.

FIG. 7 (a) is a front view of the gas/liquid supply nozzle 453 of FIGS. 4 and 5, and FIG. 7 (b) is a side view of one side of the gas/liquid supply nozzle 453 of FIGS. 4 and 5.

As shown in FIGS. 7 (a) and (b), the gas/liquid supply nozzle 453 includes the liquid nozzle 453a, the gas nozzle 453b and a casing 454.

The casing 454 has a rectangular parallelpiped shape, and its lower end is opened. The liquid nozzle 453a and the gas nozzle 453b are attached to the casing 454.

The liquid nozzle 453a and the gas nozzle 453b each have a cylindrical shape that extends in a top-to-bottom direction, and arranged to line up in a width direction of the casing 454 (the horizontal direction perpendicular to the axis of the nozzle arm 452 of FIG. 4). The lower end and a portion in the vicinity thereof of each of the liquid nozzle 453a and the gas nozzle 453b project downward from the lower end of the casing 454.

Connection holes UHa, UHb are formed on respective side surfaces in the vicinity of upper ends of the liquid nozzle 453a and the gas nozzle 453b. Discharge ports BHa, BHb are formed at respective lower ends of the liquid nozzle 453a and the gas nozzle 453b. The rinse liquid supply pipe 461 and the inert gas supply pipe 471 are connected to portions of the connection holes UHa, UHb of the liquid nozzle 453a and the gas nozzle 453b, respectively.

When the rinse liquid is supplied from the rinse liquid supply pipe 461 to the liquid nozzle 453a, the supplied rinse liquid is discharged downward from the discharge port BHa. When the inert gas is supplied from the inert gas supply pipe 471 to the gas nozzle 453b, the supplied inert gas is discharged downward from the discharge port BHb.

Here, as shown in FIG. 7 (a), a distance ND1 between the axial center of the liquid nozzle 453a and the axial center of the gas nozzle 453b, an inner diameter IDa of the liquid nozzle 453a and an inner diameter IDb of the gas nozzle 453b are determined in order to form a boundary B (FIG. 13) between a liquid layer RL of the rinse liquid (FIG. 13) and a dry region DA (FIG. 13) described below on the substrate W in a cleaning/drying step described below in the present embodiment. Respective preferable ranges of the distance ND1 and the inner diameters IDa, IDb will be described below.

Figure 8:
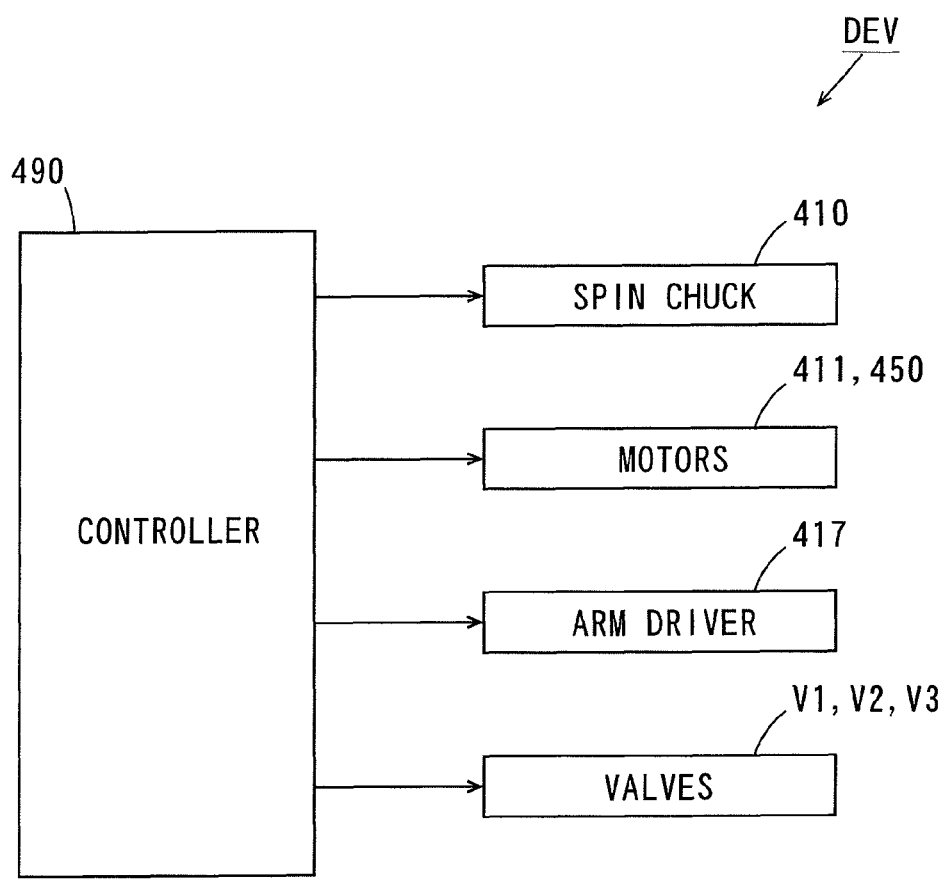
FIG. 8 is a block diagram showing a control system of the development processing device.

FIG. 8 is a block diagram showing a control system of the development processing device DEV. As shown in FIG. 8, the development processing device DEV includes a controller 490. Operations of the spin chuck 410, the motors 411, 450, the arm driver 417 and the valves V1, V2, V3 are controlled by the controller 490.

Instead of the controller 490, the main controller 11 of FIG. 1 may control the operations of the spin chuck 410, the motors 411, 450, the arm driver 417 and the valves V1, V2, V3.

(4) Operation of the Development Processing Device

Figure 9:
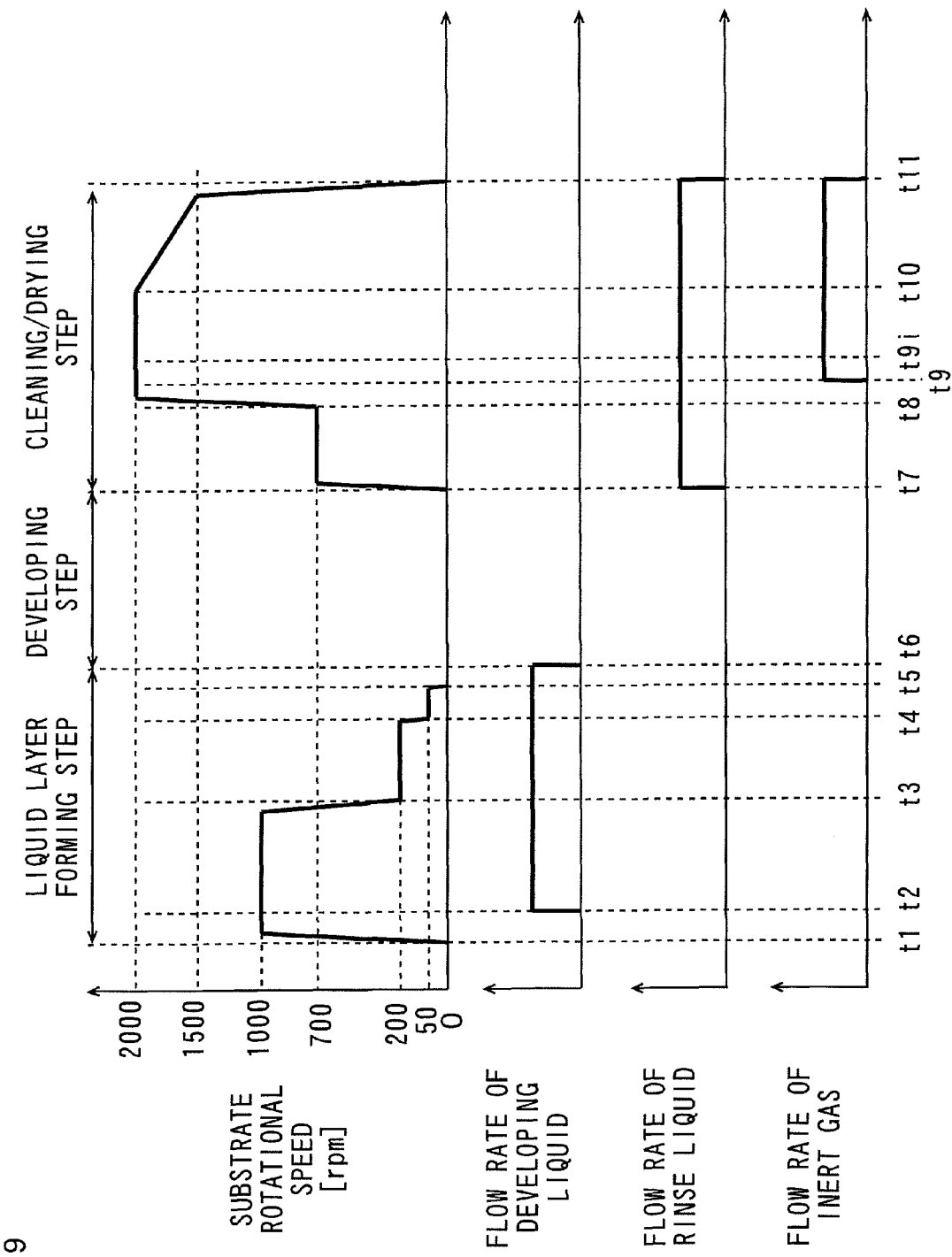
FIG. 9 is a timing chart showing changes in a rotational speed of a substrate, a flow rate of a developing liquid, a flow rate of a rinse liquid and a flow rate of an inert gas in development processing of the substrate.

Next, description will be made of an operation of the development processing device DEV. FIG. 9 is a timing chart showing changes in a rotational speed of the substrate W, a flow rate of the developing liquid, a flow rate of the rinse liquid and a flow rate of the inert gas in the development processing of the substrate W. In the present embodiment, the development processing is divided into a liquid layer forming step, a developing step and a cleaning/drying step. The development processing described below is performed after the resist film formed on the substrate W is subjected to the exposure processing.

As shown in FIG. 9, rotation of the substrate W is started by the spin chuck 410 (FIG. 4) at a time point t1 in the liquid layer forming step. At a subsequent time point t2, discharge of the developing liquid from the developing liquid nozzle 421 (FIG. 4) is started. In a period from the time point t1 to a time point t3, the rotational speed of the substrate W is maintained at 1000 rpm, for example.

The rotational speed of the substrate W drops to 200 rpm at the time point t3, and drops to 50 rpm at a time point t4, for example. Then, the rotation of the substrate W is stopped at a time point t5. At a time point t6, discharge of the developing liquid from the developing liquid nozzle 421 is stopped. In a period from the time point t2 to the time point t6, the developing liquid nozzle 421 moves between the position above the center of the substrate W and the position above the peripheral edge while discharging the developing liquid. The flow rate of discharge of the developing liquid is maintained at 400 mL/min, for example.

In the liquid layer forming step, the liquid layer of the developing liquid is formed to cover the resist film on the substrate W. Details of the liquid layer forming step will be described below.

In a period from the time point t6 to a time point t7 of the developing step, the discharge of the developing liquid and the rotation of the substrate W are stopped. A dissolution reaction of a portion excluding a pattern of the resist film by the developing liquid held on the substrate W proceeds in this period.

The cleaning/drying step is started at the time point t7. In the cleaning/drying step, the substrate W is rotated at 700 rpm, for example, by the spin chuck 410 in a period from the time point t7 to a time point t8, and the substrate W is rotated at a high speed such as 2000 rpm in a period from the time point t8 to a time point t10. The rotation of the substrate W is decelerated to a low speed such as 1500 rpm in a period from the time point t10 to a time point t11.

In a period from the time point t7 to the time point t11, the rinse liquid is discharged from the liquid nozzle 453a (FIG. 4) onto the substrate W. This causes the developing liquid and the dissolved resist on the substrate W to be washed away. The flow rate of discharge of the rinse liquid is maintained at 500 mL/min, for example.

In a period from a time point t9 to the time point t11, the inert gas is discharged from the gas nozzle 453b (FIG. 4) to the substrate W. This causes the surface of the substrate W to be dried. The flow rate of discharge of the inert gas is maintained at 30 L/min, for example.

In a period from the time point t8 to the time point t11, the motor 450 of FIG. 4 operates to cause the liquid nozzle 453a and the gas nozzle 453b to move from the position above the center of the substrate W toward the position above the peripheral edge. Details of the cleaning/drying step will be described below.

(5) The Liquid Layer Forming Step

Figure 10:
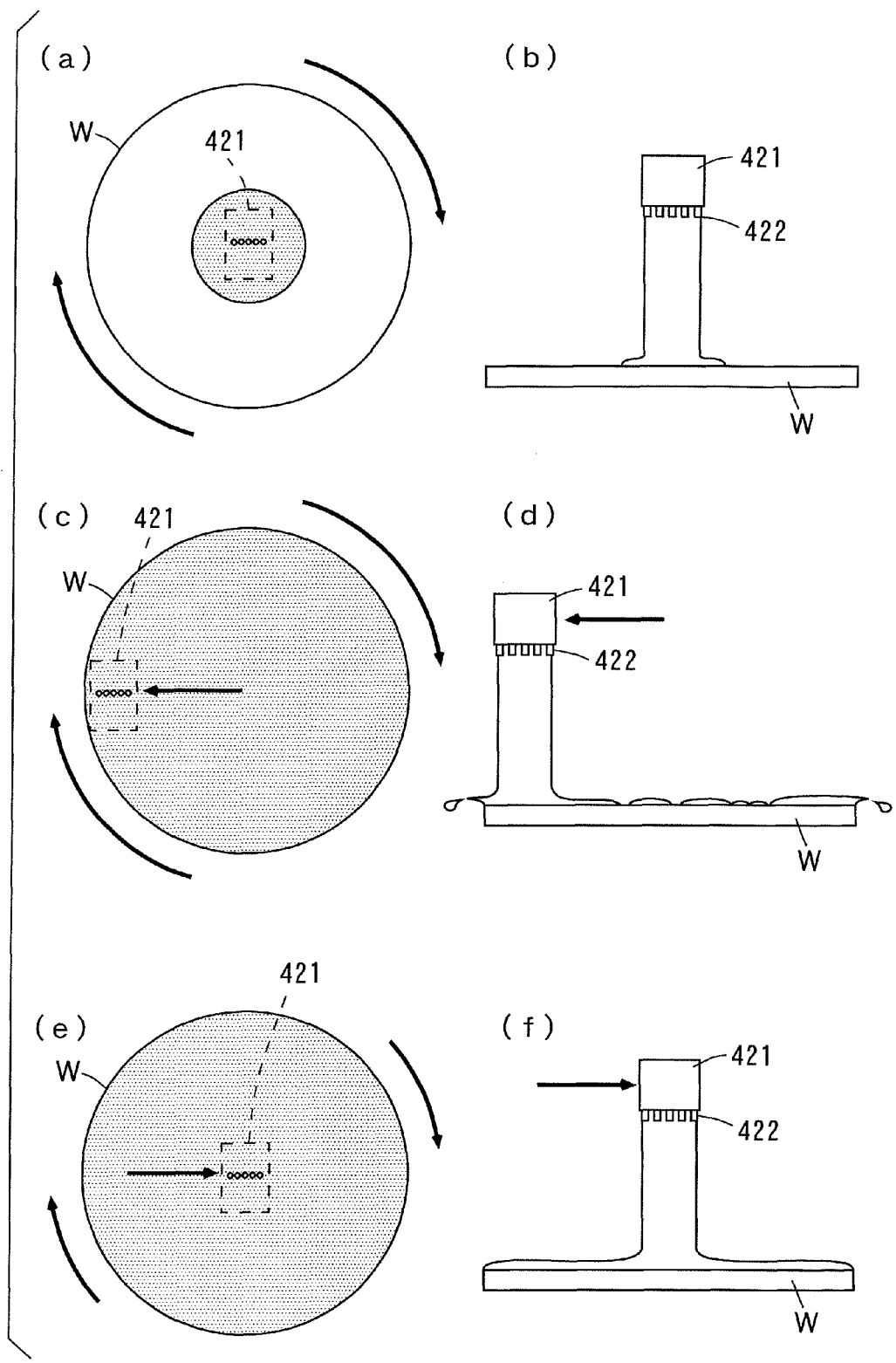
FIG. 10 is a schematic diagram for explaining operations of the development processing device in liquid layer forming step.

Description will be made of details of the operation of the development processing device DEV in the liquid layer forming step with reference to FIGS. 9 and 10. FIG. 10 is a schematic diagram for explaining the operation of the development processing device DEV in the liquid layer forming step. In FIG. 10, (a), (c), (e) are schematic plan views of the development processing device DEV, and (b), (d), (f) are schematic side views of the development processing device DEV.

As shown in (a), (b) in FIG. 10, the discharge of the developing liquid is started while the developing liquid nozzle 421 is positioned above the center of the rotating substrate W at the time point t2 of FIG. 9. Thus, the liquid layer of the developing liquid is formed at the center of the rotating substrate W.

As shown in (c), (d) in FIG. 10, the developing liquid nozzle 421 moves from the position above the center of the rotating substrate W to the position above the peripheral edge while discharging the developing liquid in a period from the time point t2 to the time point t3 of FIG. 9. Thus, the developing liquid is supplied onto the entire substrate W, and the liquid layer of the developing liquid is formed on the entire substrate W.

The rotational speed of the substrate W drops, and the developing liquid nozzle 421 moves from the position above the peripheral edge of the rotating substrate W to the position above the center while discharging the developing liquid as shown in (e), (f) in FIG. 10 in a period from the time point t3 to the time point t4 of FIG. 9. In this case, the amount of the developing liquid shaken off outward from the substrate W decreases, and the supplied developing liquid is held on the substrate W. Accordingly, the liquid layer of the developing liquid is formed on the substrate W.

(6) The Cleaning/Drying Step

Figure 11:
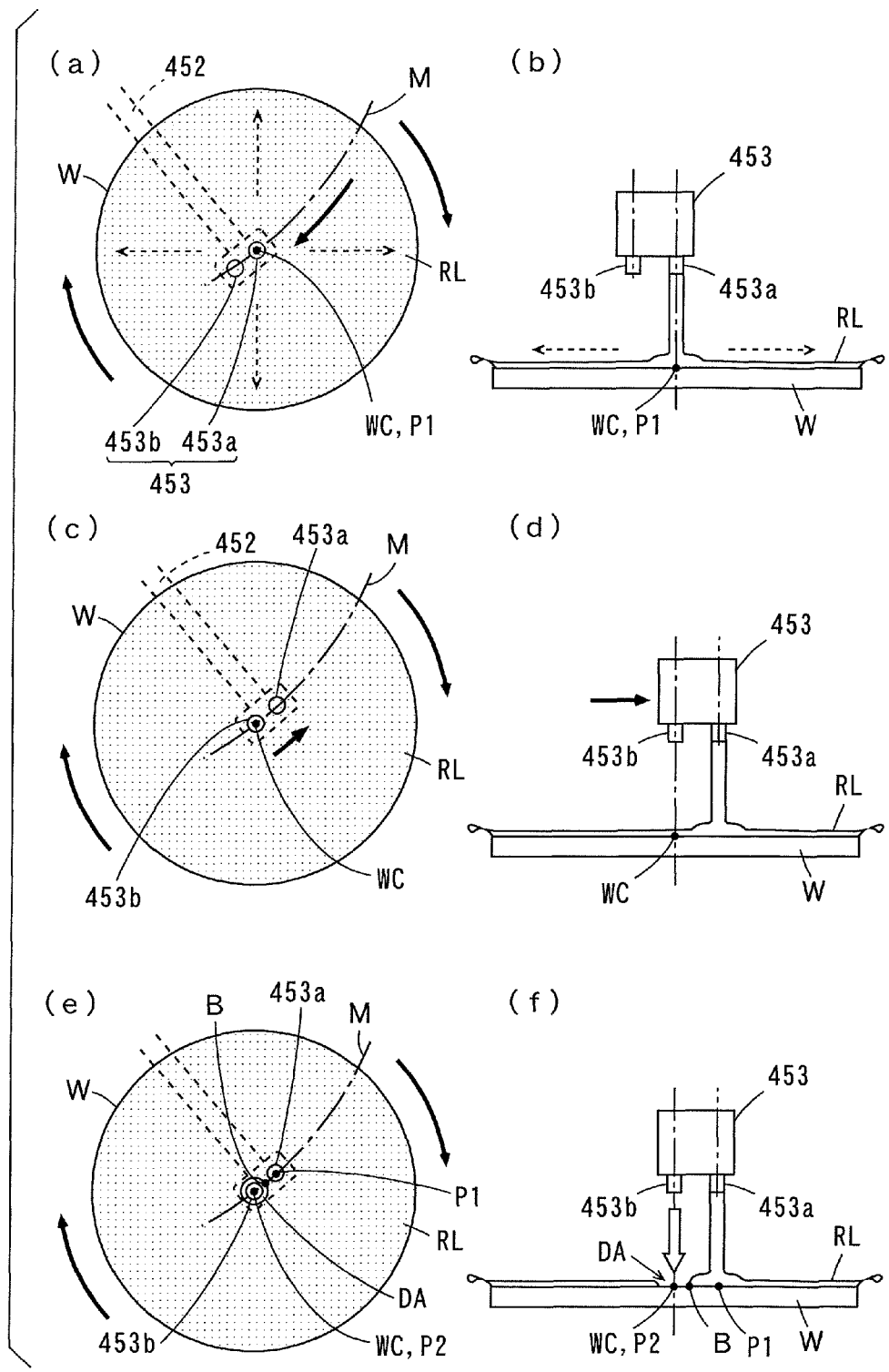
FIG. 11 is a diagram for explaining operations of the development processing device in a cleaning/drying step.
Figure 12:
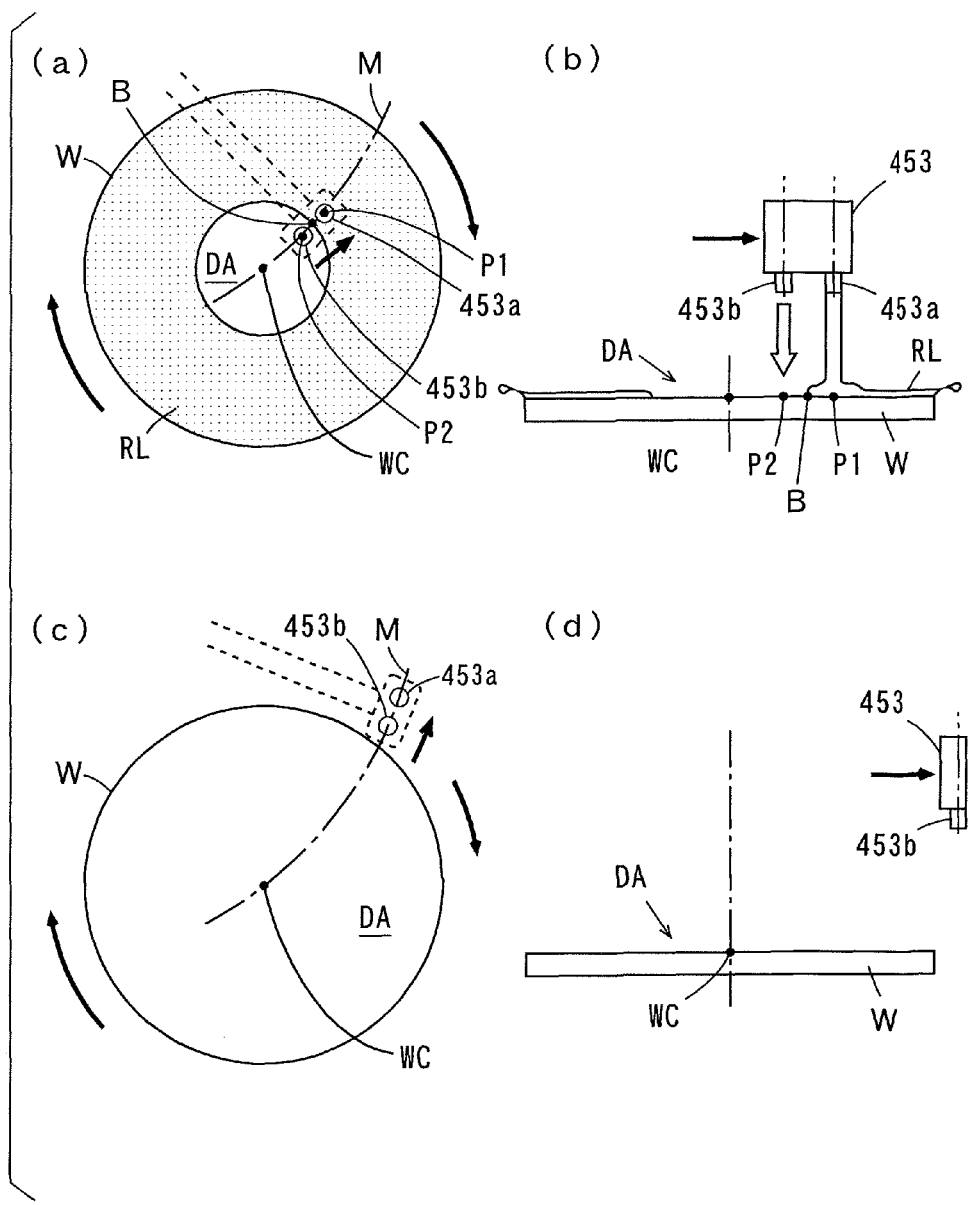
FIG. 12 is a diagram for explaining operations of the development processing device in the cleaning/drying step.

Description will be made of the operation of the development processing device DEV in the cleaning/drying step with reference to FIGS. 9, 11 and 12. FIGS. 11 and 12 are diagrams for explaining the operation of the development processing device DEV in the cleaning/drying step.

In the following description, a position on the substrate W that the rinse liquid discharged by the liquid nozzle 453a reaches (a position on the substrate W that receives the discharged rinse liquid) is referred to as a liquid position P1, and a position on the substrate W that the inert gas discharged by the gas nozzle 453b reaches (a position on the substrate W that receives the discharged inert gas) is referred to as a gas position P2.

(a), (c), (e) in FIG. 11 and (a), (c) in FIG. 12 are schematic plan views of the development processing device DEV, and (b), (d), (f) in FIG. 11 and (b), (d) in FIG. 12 are schematic side views of the development processing device DEV.

As shown in (a), (b) in FIG. 11, the substrate W rotates, and the motor 450 of FIG. 4 operates to cause the liquid nozzle 453a of the gas/liquid supply nozzle 453 to move to the position above the center WC of the rotating substrate W at the time point t7 of FIG. 9. In this state, the rinse liquid is discharged from the liquid nozzle 453a onto the rotating substrate W.

This causes the rinse liquid supplied onto the rotating substrate W to flow from the center WC toward the peripheral edge by a centrifugal force as indicated by the dotted arrows in (a), (b) in FIG. 11. The liquid layer of the developing liquid is replaced by the rinse liquid, and the surface of the substrate W is cleaned. In this manner, the liquid layer RL of the rinse liquid is formed on the entire upper surface of the rotating substrate W.

The motor 450 of FIG. 4 operates to move the gas/liquid supply nozzle 453 to move toward the position outside the substrate W at the time point t8 of FIG. 9.

During operation of the motor 450, the liquid nozzle 453a and the gas nozzle 453b move along substantially the same path above the rotating substrate W. In (a), (c), (e) in FIG. 11 and (a), (c) in FIG. 12, the movement path of the liquid nozzle 453a and the gas nozzle 453b is indicated by the one-dot and dash line M.

As shown in (c), (d) in FIG. 11, the gas nozzle 453b reaches the position above the center WC of the rotating substrate W, so that the motor 450 of FIG. 4 stops and the gas/liquid supply nozzle 453 temporarily stops at the time point t9 of FIG. 9. With the gas/liquid supply nozzle 453 stopped, the inert gas is discharged from the gas nozzle 453b onto the center WC of the rotating substrate W, As shown in (e), (f) in FIG. 11, the inert gas is discharged onto the center WC of the rotating substrate W with the gas/liquid supply nozzle 453 stopped in a period from the time point t9 to a time point t9i of FIG. 9. This causes the inert gas to be discharged onto the center WC of the rotating substrate W for a given period of time with the liquid position P1 spaced apart from the center WC of the substrate W by a given distance (the distance ND1 (FIG. 7) in this example). Accordingly, the dry region DA is formed at the center WC of the rotating substrate W, and the boundary B between the dry region DA and the liquid layer RL is formed between the liquid position P1 and the gas position P2. The period of time from the time point t9 to the time point t9i is about 0.5 sec, for example.

The centrifugal force is exerted from the center of the substrate W toward the peripheral edge on the rinse liquid discharged onto the rotating substrate W. In this example, the gas nozzle 453b discharges the inert gas onto the surface of the substrate W in a position closer than the liquid nozzle 453a to the center of the substrate W. Therefore, when the boundary B between the dry region DA and the liquid layer RL is formed between the liquid position P1 and the gas position P2, the substantially circular dry region DA whose radius equals to a distance from the center WC to the boundary B is formed on the substrate W centered around the center WC.

The motor 450 of FIG. 4 again operates, and the gas/liquid supply nozzle 453 again moves toward the position outside the substrate W at the time point t9i of FIG. 9.

As shown in (a), (b) in FIG. 12, when the gas/liquid supply nozzle 453 moves toward the position outside the substrate W at the time point t9i of FIG. 9, the boundary B between the liquid position P1 and the gas position P2 moves toward the peripheral edge of the substrate W as the liquid position P1 and the gas position P2 move on the substrate W. Thus, an outer edge of the substantially circular dry region DA is enlarged as the boundary B moves, and the dry region DA spreads from the center WC of the substrate W toward the peripheral edge of the substrate W.

The liquid nozzle 453a and the gas nozzle 453b move to a position away from the position above the peripheral edge of the substrate W at the time point t11 of FIG. 9, so that the entire upper surface of the substrate W is dried as shown in (c), (d) in FIG. 12.

As described above, the boundary B between the liquid layer RL and the dry region DA is formed between the liquid position P1 and the gas position P2 on the substrate W in the cleaning/drying step.

The rinse liquid is reliably removed by the inert gas and the surface of the substrate W is forcibly dried at the gas position P2 on the substrate W. Therefore, the rinse liquid is reliably removed at the gas position P2 even when the surface of the substrate W includes the portion having hydrophilicity (hydrophilic portion) and the portion having hydrophobicity (hydrophobic portion). Accordingly, the dry region DA is prevented from being unevenly dried.

The rinse liquid is discharged onto the liquid position P1 on the substrate W. The discharged rinse liquid flows toward the outside of the substrate W by the centrifugal force. Thus, the liquid layer RL of the rinse liquid is reliably formed outside the dry region DA. This prevents the rinse liquid from being dried by the centrifugal force or the like in a region outside the gas position P2 (region on the substrate W excluding the dry region DA that is dried by the inert gas). Accordingly, the substrate W is prevented from being unevenly dried.

Figure 13:
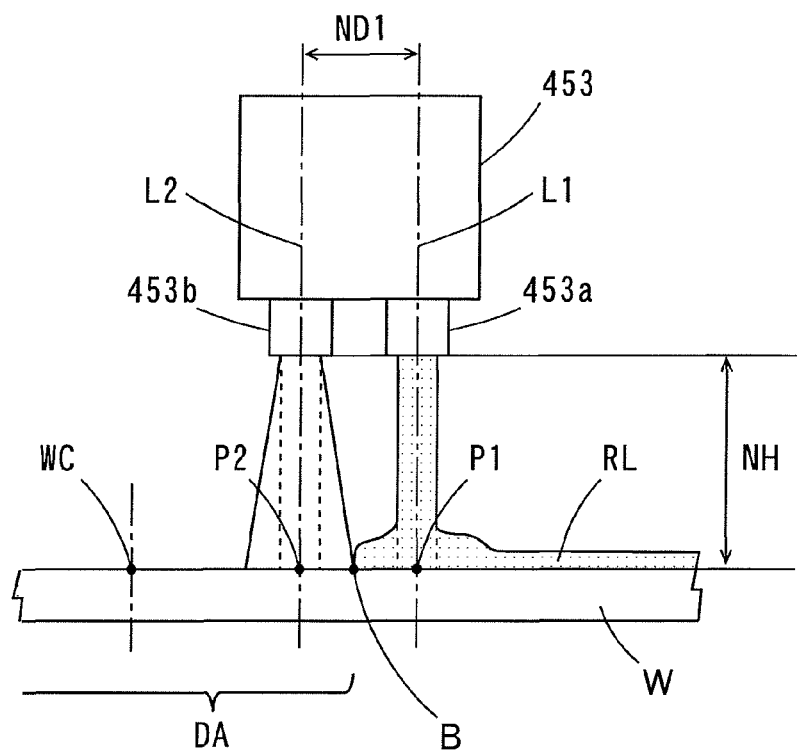
FIG. 13 is a side view showing a state where the rinse liquid and the inert gas are supplied from the gas/liquid supply nozzle onto the substrate W in the cleaning/drying step.

(7) Preferable Conditions for Forming the Boundary (7-1) Mechanism for Forming the Boundary FIG. 13 is a side view showing a state where the rinse liquid and the inert gas are supplied from the gas/liquid supply nozzle 453 onto the substrate W in the cleaning/drying step.

As shown in FIG. 13, the liquid position P1 is located at an intersection of an axial center L1 of the liquid nozzle 453a and the surface of the substrate W, and the gas position P2 is located at an intersection of an axial center L2 of the gas nozzle 453b and the surface of the substrate W.

Part of the rinse liquid discharged from the liquid nozzle 453a collides with the surface of the substrate W at the liquid position P1, thus flowing from the liquid position P1 toward the center WC, withstanding the centrifugal force.

At this time, the inert gas discharged from the tip of the gas nozzle 453b collides with the surface of the substrate W in a range of a predetermined width around the gas position P2. Thus, the rinse liquid flowing from the liquid position P1 toward the center WC and the inert gas colliding with the substrate W interact with each other between the liquid position P1 and the gas position P2. As a result, the boundary B is formed in the portion where the rinse liquid and the inert gas interact with each other.

(7-2) Configuration of the Gas/Liquid Supply Nozzle

Figure 14:
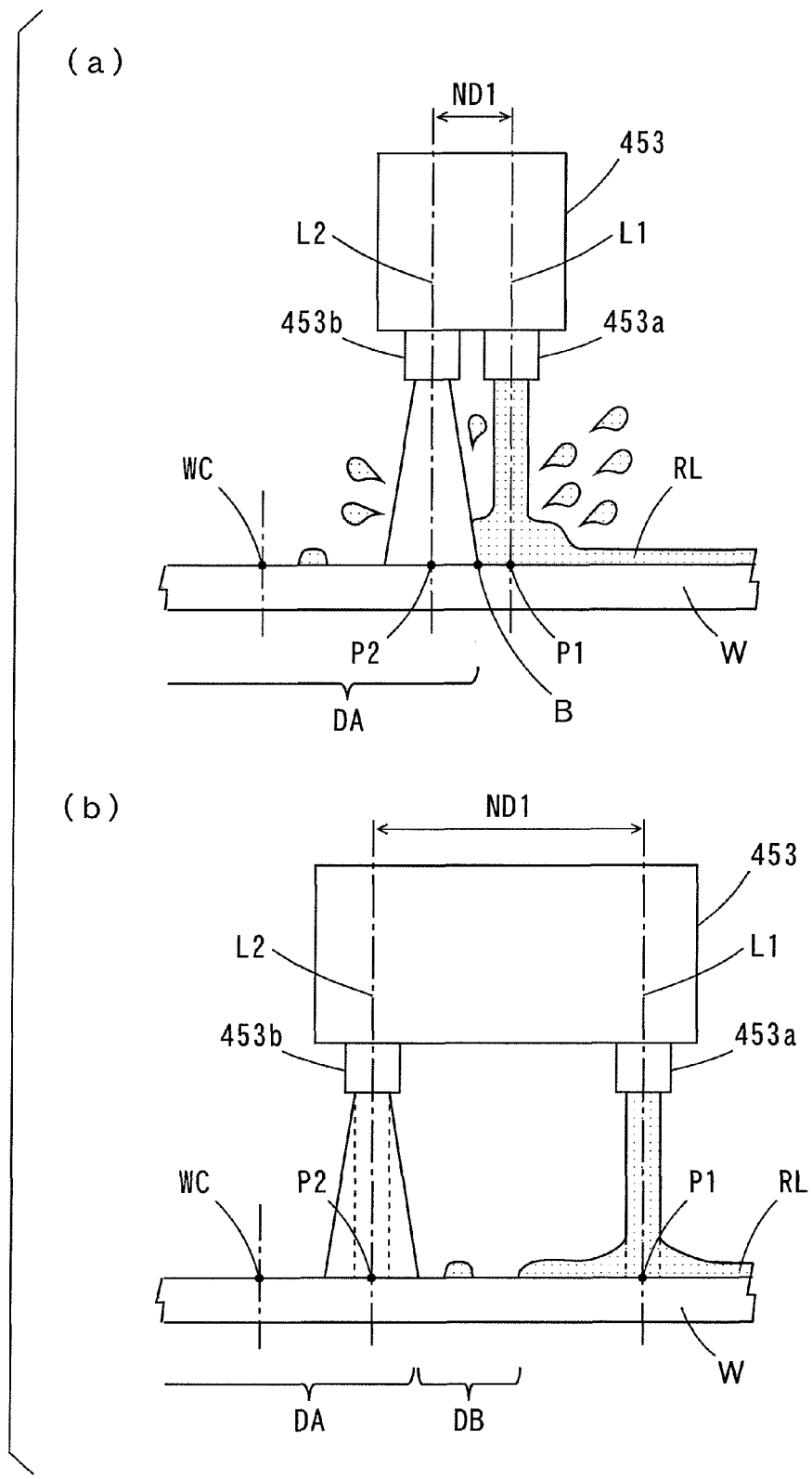
FIG. 14 is a side view for explaining effects of a distance between a liquid position and a gas position on formation of a boundary.

As described above, the boundary B is formed by causing the rinse liquid and the inert gas to interact with each other between the liquid position P1 and the gas position P2. FIG. 14 is a side view for explaining effects of the distance between the liquid position P1 and the gas position P2 on formation of the boundary B.

When the distance between the liquid position P1 and the gas position P2 is too small as shown in FIG. 14 (a), the rinse liquid flowing from the liquid position P1 toward the center WC and the inert gas colliding with the gas position P2 are liable to excessively interact with each other. This makes it difficult to stably form the boundary B, and the rinse liquid easily splashes from the surface of the substrate W.

Meanwhile, when the distance between the liquid position P1 and the gas position P2 is too large as shown in FIG. 14 (b), the rinse liquid is shaken off by the centrifugal force to cause the surface of the substrate W between the liquid position P1 and the gas position P2 to be locally dried in some cases (see a region indicated by the symbol DB in FIG. 14 (b)). In this case, the boundary B is unlikely to be formed.

Therefore, the distance between the liquid position P1 and the gas position P2, that is, the distance ND1 between the axial center L1 of the liquid nozzle 453a and the axial center L2 of the gas nozzle 453b is preferably not less than 12 mm and not more than 22 mm, and is more preferably 17 mm in order to cause the rinse liquid and the inert gas to reliably interact with each other and stably form the boundary B.

In addition, the inner diameter IDa (FIG. 7) of the discharge port BHa (FIG. 7) of the liquid nozzle 453a and the inner diameter IDb (FIG. 7) of the discharge port BHb (FIG. 7) of the gas nozzle 453b are each preferably not less than 2 mm and not more than 6 mm, and is more preferably 4 mm in order to cause the rinse liquid and the inert gas to reliably interact with each other and stably form the boundary B. The inner diameters IDa, IDb may be equal to each other or different from each other.

(7-3) Arrangement of the Gas/Liquid Supply Nozzle

FIG. 15 is a side view for explaining effects of the height of the gas/liquid supply nozzle 453 from the surface of the substrate W on formation of the boundary B.

As shown in FIG. 15, when the height from the surface of the substrate W to the discharge port BHa of the liquid nozzle 453a and the discharge port BHb of the gas nozzle 453b is too small, the rinse liquid flowing from the liquid position P1 toward the center WC and the inert gas colliding with the gas position P2 are liable to excessively interact with each other. This makes it difficult to stably form the boundary B, and the rinse liquid easily splashes from the surface of the substrate W.

When the height from the surface of the substrate W to the discharge port BHa of the liquid nozzle 453a and the discharge port BHb of the gas nozzle 453b is too large, the rinse liquid and the inert gas discharged from the discharge ports BHa, BHb onto the substrate W are easily affected by airflow generated in a space above the substrate W. In this case, the boundary B is unlikely to be stably formed.

Therefore, the gas/liquid supply nozzle 453 is preferably arranged such that the height from the surface of the substrate W to the discharge ports BHa, BHb is not less than 10 mm and not more than 40 mm in order to cause the rinse liquid and the inert gas to reliably interact with each other and stably form the boundary B.

(7-4) Discharge Flow Rate of the Rinse Liquid

An excessively high flow rate of the rinse liquid discharged from the liquid nozzle 453a onto the substrate W increases interaction between the rinse liquid and the inert gas, thus causing the boundary B to be unlikely to be stably formed and causing the rinse liquid to easily splash from the surface of the substrate W. An excessively low flow rate of the rinse liquid discharged from the liquid nozzle 453a onto the substrate W causes the rinse liquid and the inert gas to be unlikely to interact with each other, and the boundary B is unlikely to be stably formed.

Therefore, the flow rate of the rinse liquid discharged from the liquid nozzle 453a onto the substrate W is preferably not less than 150 mL/min and not more than 800 mL/min in order to cause the rinse liquid and the inert gas to reliably interact with each other and stably form the boundary B.

(7-5) Discharge Flow Rate of the Inert Gas

An excessively high flow rate of the inert gas discharged from the gas nozzle 453b onto the substrate W increases interaction between the rinse liquid and the inert gas, thus causing the boundary B to be unlikely to be stably formed and causing the rinse liquid to easily splash from the surface of the substrate W. An excessively low flow rate of the inert gas discharged from the gas nozzle 453b onto the substrate W causes the rinse liquid and the inert gas to be unlikely to interact with each other, and the boundary B is unlikely to be stably formed.

Therefore, the flow rate of the inert gas discharged from the gas nozzle 453b onto the substrate W is preferably not less than 10 L/min and not more than 40 L/min in order to cause the rinse liquid and the inert gas to reliably interact with each other and stably form the boundary B.

(7-6) Rotational Speed of the Substrate

The substrate W is rotated by the spin chuck 410 of FIG. 5 in the cleaning/drying step. Thus, the centrifugal force from the center WC toward the outside of the substrate W is exerted on the rinse liquid discharged from the liquid nozzle 453a onto the substrate W depending on the distance from the center WC of the substrate W to the liquid position P1 and the rotational speed of the substrate W as shown in FIG. 13.

When the centrifugal force exerted on the rinse liquid is small, a large amount of rinse liquid flows from the liquid position P1 (FIG. 13) toward the center WC (FIG. 13). In this case, the rinse liquid and the inert gas excessively interact with each other, and the rinse liquid easily splashes from the surface of the substrate W.

Meanwhile, when the centrifugal force exerted on the rinse liquid is large, the rinse liquid is unlikely to flow from the liquid position P1 (FIG. 13) toward the center WC (FIG. 13). This makes it difficult to cause the rinse liquid and the inert gas to interact with each other, and to stably form the boundary B.

When the liquid position P1 moves from the center WC toward the peripheral edge of the substrate W with the substrate W rotating at a constant speed, the centrifugal force exerted on the rinse liquid on the position P1 becomes larger as the liquid position P1 is located away from the center WC.

When the rotational speed of the substrate W changes with the liquid position P1 maintained at any position between the center WC and the peripheral edge of the substrate W, the centrifugal force exerted on the rinse liquid on the liquid position P1 is increased as the rotational speed becomes higher.

Accordingly, the rotational speed of the substrate W is preferably increased (2000 rpm or more, for example) when the liquid position P1 moves in the vicinity of the center WC of the substrate W, and the rotational speed is preferably decreased (1500 rpm or less, for example) as the liquid position P1 comes close to the peripheral edge of the substrate W.

Specifically, when the diameter of the substrate W to be processed is 300 mm, the rotational speed of the substrate W is maintained at 2000 rpm or more in a period where the liquid position P1 moves from the center WC toward the peripheral edge by a distance of about half the radius of the substrate W (about 70 mm). Meanwhile, the rotational speed of the substrate W is decreased to 1500 rpm or less in a period where the liquid position P1 at the distance of about half the radius of the substrate W (about 70 mm) from the center WC moves toward the peripheral edge. This allows the rinse liquid and the inert gas to reliably interact with each other and allows the boundary B to be stably formed.

(7-7) Moving Speed of the Gas/Liquid Supply Nozzle

When moving speeds of the liquid position P1 and the gas position P2 from the center WC toward the peripheral edge of the substrate W is too high, a sufficient amount of inert gas cannot be discharged onto the substrate W. This makes it difficult to remove the rinse liquid on the substrate W and to stably form the boundary B.

When the moving speeds of the liquid position P1 and the gas position P2 from the center WC toward the peripheral edge of the substrate W is too low, the rinse liquid and the inert gas excessively interact with each other, and the rinse liquid easily splashes from the surface of the substrate W.

Therefore, the moving speed of the gas/liquid supply nozzle 453 is preferably not less than 2 mm/sec and not more than 15 mm/sec in order to cause the rinse liquid and the inert gas to reliably interact with each other and to stably form the boundary B.

(8) Effects

As described above, when the cleaning/drying step is started, the substrate W rotates and the liquid nozzle 453a of the gas/liquid supply nozzle 453 moves to the position above the center WC of the rotating substrate W in the development processing device DEV according to the present embodiment. In this state, the rinse liquid is discharged from the liquid nozzle 453a onto the rotating substrate W. The rinse liquid discharged onto the center WC of the rotating substrate W spreads toward the peripheral edge of the substrate W, so that the liquid layer RL is formed on the entire surface of the substrate W.

Then, the gas/liquid supply nozzle 453 moves toward the position outside the substrate W. The gas nozzle 453b reaches the position above the center WC of the rotating substrate W, so that the gas/liquid supply nozzle 453 temporarily stops. With the gas/liquid supply nozzle 453 stopped, the inert gas is discharged onto the center WC of the rotating substrate W for the give period of time. This causes the dry region DA to be formed at the center WC of the substrate W. Accordingly, the boundary B is stably formed between the liquid layer RL of the rinse liquid and the dry region DA.

After that, the gas/liquid supply nozzle 453 again moves toward the position outside the substrate W. The surface of the substrate W is forcibly dried at the gas position P2. Thus, the rinse liquid is reliably removed at the gas position P2 even when the surface of the substrate W includes the portion having hydrophilicity and the portion having hydrophobicity.

The rinse liquid discharged onto the substrate W flows toward the peripheral edge of the substrate W because of the centrifugal force. Therefore, the gas position P2 is moved to follow the movement path of the liquid position P1, so that the dry region DA formed at the center WC of the substrate W is enlarged from the center WC toward the peripheral edge of the substrate W with the boundary B stably formed between the liquid layer RL of the rinse liquid and the dry region DA. In this manner, the liquid layer RL of the rinse liquid is reliably formed outside the dry region DA formed on the substrate W. This prevents the region on the substrate W excluding the dry region DA from being dried because of the centrifugal force.

Accordingly, the substrate W is reliably prevented from being unevenly dried. This prevents an occurrence of processing defects of the substrate W to be caused by the rinse liquid adhering to the cleaned substrate W.

(9) Other Embodiments (9-1)

The gas/liquid supply nozzle 453 may be attached to the nozzle arm 452 such that the axial centers L1, L2 of the liquid nozzle 453a and the gas nozzle 453b are inclined with respect to the surface of the substrate W.

For example, the gas/liquid supply nozzle 453 is attached to the nozzle arm 452 such that the rinse liquid and the inert gas are discharged onto the substrate W along the rotational direction of the substrate. This reduces colliding forces generated between the surface of the substrate W and the rinse liquid/inert gas when the rinse liquid and the inert gas discharged from the liquid nozzle 453a and the gas nozzle 453b, respectively, come in contact with the surface of the substrate W. As a result, the rinse liquid can be sufficiently prevented from splashing.

(9-2)

While description is made of the substrate cleaning method for drying the substrate W by discharging the inert gas while discharging the rinse liquid onto the substrate W in the foregoing embodiment, the substrate cleaning method is applicable to various types of processing including the step of cleaning and drying the substrate W, not limited to the foregoing development processing.

(9-3)

While description is made of the example in which the inert gas is discharged onto the substrate W in order to dry the substrate W in the foregoing embodiment, another gas such as air instead of the inert gas may be used as a gas for drying the substrate W.

(10) Correspondences Between Elements in the Claims and Parts in Embodiments

In the following paragraphs, non-limiting examples of correspondences between various elements recited in the claims below and those described above with respect to various preferred embodiments of the present invention are explained.

In the above-described embodiments, the liquid nozzle 453a is an example of a first nozzle, the gas nozzle 453b is an example of a second nozzle, the discharge port BHa is an example of a first discharge port, and the discharge port BHb is an example of a second discharge port.

The development processing device DEV is an example of a substrate cleaning device, the spin chuck 410 is an example of a substrate holder, and the motor 411 and the rotation shaft 412 are an example of a rotation driver.

The motor 450, the rotation shaft 451 and the nozzle arm 452 are an example of a first nozzle moving mechanism and a second nozzle moving mechanism, the controller 490 is an example of a controller, and the motor 450, the rotation shaft 451, the nozzle arm 452 and the casing 454 are examples of a holder.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A substrate cleaning method for cleaning and drying a substrate, comprising the steps of:

rotating the substrate around an axis perpendicular to the substrate while substantially horizontally holding the substrate;

discharging pure water onto the center of the substrate that rotates using a first nozzle that discharges the pure water, to form a liquid layer of the pure water on the substrate;

moving said first nozzle such that a position on the substrate that receives the pure water discharged from said first nozzle moves from the center of the substrate toward a peripheral edge of the substrate by a given distance;

forming a dry region at the center of the substrate by discharging an inert gas onto the center of the substrate for a given period of time using a second nozzle that discharges the inert gas while holding a state where the position on the substrate that receives said pure water is spaced apart from the center of the substrate by the given distance; and after the dry region is formed at the center of the substrate, moving said first nozzle such that the position on the substrate that receives said pure water is continuously moved toward the peripheral edge of the substrate, and continuously moving said second nozzle such that a position on the substrate that receives the inert gas discharged from said second nozzle follows a movement path of the position on the substrate that receives said pure water while being spaced apart from the position on the substrate that receives said pure water by said given distance, wherein said step of continuously moving said first and second nozzles includes the step of adjusting at least one of a flow rate of the pure water discharged from said first nozzle, a flow rate of the inert gas discharged from said second nozzle, a rotational speed of the substrate, and a moving speed of each of said first and second nozzles, such that part of the pure water that is discharged from said first nozzle onto the substrate and spreads on the substrate and part of the inert gas that is discharged from said second nozzle onto the substrate interact with each other, so that a boundary is formed between the liquid layer of the pure water and the dry region on the substrate at a portion where the pure water discharged from said first nozzle and the inert gas discharged from said second nozzle interact with each other without splashing of the pure water, and the formed boundary is moved toward the peripheral edge of the substrate.

2. The substrate cleaning method according to claim 1, wherein
said step of rotating the substrate includes the step of gradually or continuously changing the rotational speed of the substrate such that the substrate rotates at a first rotational speed with the position on the substrate that receives said pure water located at the center of the substrate and the substrate rotates at a second rotational speed that is lower than said first rotational speed with the position on the substrate that receives said pure water located at the peripheral edge of the substrate.

3. The substrate cleaning method according to claim 1, wherein said given distance is not less than 12 mm and not more than 22 mm.

4. The substrate cleaning method according to claim 1, wherein
said first nozzle has a first discharge port from which the pure water is discharged,
said second nozzle has a second discharge port from which the inert gas is discharged, and
a height from the surface of the substrate to said first discharge port and a height from the surface of the substrate to said second discharge port are each not less than 10mm and not more than 40 mm.

5. The substrate cleaning method according to claim 4, wherein an inner diameter of each of said first and second discharge ports is not less than 2 mm and not more than 6 mm.

6. The substrate cleaning method according to claim 4, wherein
a flow rate of the pure water discharged from said first discharge port is not less than 150 mL/min and not more than 800 mL/min, and
a flow rate of the inert gas discharged from said second discharge port is not less than 10 L/min and not more than 40 L/min.

* * * * *